(12) United States Patent
Zimmerman et al.

(10) Patent No.: US 9,058,989 B2
(45) Date of Patent: Jun. 16, 2015

(54) LARGE AREA THIN FREESTANDING NITRIDE LAYERS AND THEIR USE AS CIRCUIT LAYERS

(71) Applicants: Scott M. Zimmerman, Basking Ridge, NJ (US); Karl W. Beeson, Princeton, NJ (US); William R. Livesay, San Diego, CA (US); Richard L. Ross, Del Mar, CA (US)

(72) Inventors: Scott M. Zimmerman, Basking Ridge, NJ (US); Karl W. Beeson, Princeton, NJ (US); William R. Livesay, San Diego, CA (US); Richard L. Ross, Del Mar, CA (US)

(73) Assignee: Goldeneye, Inc., San Diego, CA (US)

( * ) Notice: Subject to any disclaimer, the term of this patent is extended or adjusted under 35 U.S.C. 154(b) by 0 days.

(21) Appl. No.: 14/020,894

(22) Filed: Sep. 8, 2013

(65) Prior Publication Data
US 2014/0147993 A1    May 29, 2014

Related U.S. Application Data

(63) Continuation of application No. 12/462,295, filed on Jul. 31, 2009, now Pat. No. 8,633,493.

(60) Provisional application No. 61/188,115, filed on Aug. 4, 2008.

(51) Int. Cl.
| | |
|---|---|
| *H01L 21/02* | (2006.01) |
| *H01L 21/20* | (2006.01) |
| *H01L 29/20* | (2006.01) |
| *H01L 31/0392* | (2006.01) |
| *H01L 31/18* | (2006.01) |
| *H01L 33/32* | (2010.01) |
| *H01L 33/00* | (2010.01) |

(52) U.S. Cl.
CPC ........ *H01L 21/0254* (2013.01); *H01L 21/2007* (2013.01); *H01L 29/2003* (2013.01); *H01L 31/0392* (2013.01); *H01L 31/1836* (2013.01); *H01L 31/1852* (2013.01); *H01L 33/007* (2013.01); *H01L 33/32* (2013.01); *Y02E 10/544* (2013.01); *H01L 2924/0002* (2013.01); *H01L 2224/48091* (2013.01); *H01L 2924/1461* (2013.01)

(58) Field of Classification Search
CPC ............... H01L 21/0254; H01L 21/02458; H01L 21/02433; H01L 21/02647
USPC ........................................................ 438/478
See application file for complete search history.

(56) References Cited

U.S. PATENT DOCUMENTS

| | | | |
|---|---|---|---|
| 4,456,490 A | 6/1984 | Dutta et al. | |
| 5,679,152 A | 10/1997 | Tischler et al. | |
| 6,924,159 B2 | 8/2005 | Usui et al. | |
| 7,282,381 B2 | 10/2007 | Feltin et al. | |
| 8,118,934 B2 * | 2/2012 | Wang | 117/94 |
| 8,541,869 B2 * | 9/2013 | Nakamura et al. | 257/627 |
| 2007/0116972 A1 | 5/2007 | Persky | |
| 2008/0182353 A1 | 7/2008 | Zimmerman et al. | |
| 2008/0258165 A1 | 10/2008 | Zimmerman et al. | |

* cited by examiner

*Primary Examiner* — Roy Potter
(74) *Attorney, Agent, or Firm* — William Propp, Esq.

(57) ABSTRACT

Thin flat crack-free freestanding nitride layers are fabricated by laser patterning of the interface and/or opposing surface of the nitride layer. The nitride layer is substantially flat once removed from the non-native substrate. The thin flat crack free nitride layers are between 3 and 250 microns thick and can have areas greater than 1 cm².

5 Claims, 48 Drawing Sheets

LARGE AREA THIN FREESTANDING NITRIDE LAYERS AND THEIR USE AS CIRCUIT LAYERS

REFERENCE TO PRIOR APPLICATION

This application is a continuation of U.S. application Ser. No. 12/462,295 filed Jul. 31, 2009 which claims the benefit of U.S. Provisional Patent Application Ser. No. 61/188,115, which was filed on Aug. 4, 2008, all commonly assigned as the present application and herein incorporated by reference.

BACKGROUND OF THE INVENTION

Nitrides offer a unique range of properties compared to other semiconducting materials like silicon and silicon carbide. Wide band gap materials like gallium nitride (GaN), aluminum gallium nitride (AlGaN), and aluminum nitride (AlN) are finding applications in high frequency devices, high power devices, LEDs, optoelectronics, bio-technology, and high efficiency electronics. The opportunity exists for integration of these devices into a single nitride layer. Nitrides offer a unique mix of optical transparency through the visible and UV spectrum, high thermal conductivity, chemical resistance, piezoelectric properties, laseability, biocompatibility and high frequency capability.

The use of nitrides in most applications has been limited by the lack of low cost high crystal quality material. Nitrides have proven difficult to grow economically in high quality single crystal form due to the high temperatures and narrow growth conditions. While this work may eventually yield low defect density material, the cost of those materials will be inherently high.

In most applications, freestanding nitride layers are preferred. Freestanding layers typically yield higher performing devices, the ability to cleave, implant within in the body, form piezoelectric elements, lase high precision parts, regrowth low defect density layers, eliminate extra thermal boundary layers, operate in harsh chemical environments, operate at higher frequencies, form a freestanding waveguide, anneal, and form a 3 dimensional structure. These uses and devices are all compromised if a growth substrate is required.

In most of these cases, the need is for thin (less than 200 micron thick) nitride layers with sufficient area to allow for economical processing. HVPE in particular has been used to grow thick layers typically 1 cm thick on a variety of growth substrates. The thick layer is then sliced into thick wafers typically 400 microns thick. These layers are usually 1 cm×1 cm in area due to difficulty in growing large area wafers using this approach. Several authors have disclosed the use of separation techniques to remove thin layers of nitride from a growth substrate. These techniques include chemical etching of the growth substrate, mechanical grinding, laser separation, and the use of release layers such as void assisted separation. The problem with these approaches is that the stresses induced from the lattice mismatch between the growth substrate and the nitride layer tends to create bowing issues with the nitride layer on the growth substrate and the freestanding nitride layer. In addition, these techniques tend to fracture or damage the nitride layer unless very thick layers are grown. These very thick layers tend to exhibit high degree warpage due to the lattice mismatch between the growth substrate and the nitride layer. Bow on a 100 micron thick HVPE layer grown on 3 inch sapphire wafer can easily exceed several hundred microns across the wafer. This leads to either the need for significant material removal or the use of a supporting substrate.

Waferbonding is typically used to support thin nitride layers which compromises the usefulness and surface properties of the nitride layer. The need exists for techniques, which can create low cost thin nitride layers with sufficient area and flatness to be useful in a wide range of applications. The need also exists for techniques in which the curvature of and/or stresses within thin nitride layers can be controlled. The intent of this invention is to disclose stress control and/or annealing techniques based on radiation processing which meet these needs. The need also exists for packaging, devices, and applications which can take advantage of the material properties these nitride layers provide. The need for freestanding nitride films is driven by a number of requirements. Crystal quality is one important factor.

Nitride crystal quality has been the subject of significant study due to its effect on device performance. Surprisingly, the lack of a cost effective bulk crystal growth method for nitrides has not hindered a variety of applications to be created especially light emitting diodes (LEDs). However, the need still exists for free standing high crystal quality nitride layers for a variety of applications such as high powered devices. While as stated earlier, thick HVPE grown freestanding nitrides have been demonstrated, they are not cost effective and cannot be grown as large areas. Typically 400 to 500 micron thick wafers must be sliced from cm thick boules grown on non-native substrates. These wafers require subsequent epitaxial polish to create an epitaxial ready surface. After processing, the wafers must be thinned to a reasonable thickness if low thermal impedance is required. The limited size, thickness and defects created by the epitaxial polishing limits this approach as a cost effective process.

A variety of techniques have been used to create cost effective nitride epitaxial layers on non-native substrates. These efforts typically have been focused on nitride growth on non-native substrates like sapphire, SiC, silicon, glass and various other materials. In each case, high defect densities in excess of $10^8/cm^2$ are typically created. In these cases, the non-native substrate typically degrades the thermal performance of the device or must be removed. Unfortunately, the stresses in nitride layers grown in this manner require the use of support substrates, which then degrade the thermal performance of the device. Various regrowth techniques for reducing the number and type of defects have been demonstrated such as epitaxial lateral overgrowth of a seed or initial nitride layer. These regrowth techniques typically require additional patterning steps, which limits the cost effectiveness of this approach. They also all require the use of a supporting layer which means that the inherent stresses and strains induced between the non-native substrate and the nitride layer during the initial growth are still present even during the regrowth process. The need exists for cost effective techniques, which enable regrowth of higher crystal quality layers on freestanding nitride layers.

This invention creates thin freestanding nitrides layers of size and flatness sufficient for regrowth as well as feature formations along specific crystal planes which can be used reduces defect densities of the subsequent regrowth layers. The ability to grow polar and non-polar nitride layers on non-native substrates using cost effective methods such as HVPE has been demonstrated. The ability of create freestanding thin nitride layers both polar and non-polar with sufficient flatness, area, and mechanical integrity for handling, processing, and regrowth processes is disclosed in this invention. The unsupported nature of the thin nitride layers also reduces defect density in the regrowth layers.

Using the techniques of this invention, a variety of surface features can be created during the separation process. More specifically, very high aspect ratio features not possible with etching techniques can be formed simultaneous to separation. The spacing of these features can be less than 5 microns. Removal/separation techniques can create thin higher crystal quality thin nitride layers after regrowth by removing at least a portion of the original nitride layer. The use of this approach is preferred especially for the purpose of forming higher quality AlGaN and AlN layers from an original GaN layer.

The need also exists for techniques in which the strains induced by epitaxial growth on non-native substrates can be manipulated for improved device performance, packaging, and cooling. Strain control in silicon has proven a very effective tool in increasing mobility of electrons. While this effect is on atomic scale, the control of strain based on the physical constraint of the nitride layer can modify the device performance. This effect can control device performance.

While SiC has a higher thermal conductivity than high dislocation defect density GaN, low dislocation defect density GaN approaches the thermal conductivity of SiC and may eventually be higher than SiC as crystal quality, point defects, and purity improves. More importantly, high power density devices are not limited by just the thermal conductivity of the materials. Typically thermal boundary interface resistances dominate as power densities exceed several W/mm$^2$. While it would appear obvious that the higher thermal conductivity of SiC, diamond, and other exotic materials would enhance the thermal performance of a device, in actuality, there is a fundamental problem associated with any non-native growth substrate. Phonons reflect at epitaxial boundaries just as photons reflect at index changes due to Fresnel reflections. In addition, added thickness is required to compensate for the stresses induced due to thermal expansion and lattice mismatch between the nitrides and the non-native substrate. Since the temperature difference from a purely thermal conduction standpoint is directly proportional to thickness it is important to minimize the distance between the junction and the cooling media. As an example, typically more than 100 microns of SiC is required at 350 W/m/K to support a GaN epitaxial layer and maintain reasonable flatness for die sizes with areas of 1 mm$^2$. Low dislocation GaN has thermal conductivity exceeding 200 W/m/K.

Using the techniques disclosed in this invention, the present inventors have been able to create large area (greater than 1 cm$^2$) flat nitride layers with thicknesses less than 30 microns without any additional support structure. Taking only bulk thermal conduction into account, the junction temperature of the GaN on GaN device will be half that of the GaN on SiC device. If the thermal boundary layer created by the epitaxial mismatch between the GaN and SiC is also included in the model, the temperature difference between the two example die is even more dramatic. There is also experimental data, which shows that the thermal boundary resistance increases with temperature, which can lead to a thermal runaway condition for the GaN on SiC device. Finally, the transient thermal response of the GaN on SiC is even more problematic because the thermal boundary layer is typically in close proximity to the junction, which exhibits very low thermal mass. In a manner similar to an optical cavity, localization can occur limiting significantly the operation point of the GaN on SiC with regard to high power pulsed operation. This localization of heat right at the junction area is mainly due to multiple reflections of the phonons at the GaN/SiC interface. The need exists therefore for nitride substrates, device structures and packaging which minimizes the distance between the junction and the final cooling means and also reduces the number of thermal boundary resistance interfaces such that very high power densities both CW and transient can be realized.

The anisotropic nature of the nitride crystal structure has a significant impact on the performance of the devices made using this material. Significant effort has been put forth on using multiple growth planes to control high current droop and other performance parameters in LEDs and electrical devices. These effects mainly relate to the piezoelectric fields created within the growth layers and how they effect the movement of charge within the device. The mounting configuration and how it mechanically constrains the device, at least for thin nitride layers, can also influence device performance. It appears that the stresses induced by constraining the nitride layer either via a non-native growth layer or via a support layer to which a thin nitride layer is transferred via waferbonding and laser liftoff has a significant effect on the optical, electrical, thermal, and mechanical performance of the resulting device. The need exists for techniques for controlling stress in thin nitride layers and devices and packaging, which takes into account the effect of stresses created by restraining the thin nitride layer. A wide range of devices properties are affected by these issues ranging from droop in LEDs to reduced operating range in HEMTs etc.

Dutta (U.S. Pat. No. 4,456,490) first disclosed in the 80s the use of backside laser irradiation through a substrate substantially transparent to the laser irradiation to modify a semiconductor layer on the substrate, which was absorptive to the laser irradiation. Several other authors have disclosed the use of backside laser irradiation to modify/convert at least a portion of an absorptive semiconductor layer on a substantially transparent substrate. They disclose the use of irradiation in a wavelength range transparent to the substrate but absorbed by the semiconductor layer. In this approach, the decomposition of GaN into gallium and nitrogen creates an explosive reaction at the interface, which leads to separation due to the expansion of the nitrogen and conversion of the GaN is gallium metal.

Alternately, other authors have disclosed the use of various mechanical, thermal, and chemical means to allow for separation of the semiconductor layer from the non-native substrate. Practically, thin semiconductor layers have required bonding techniques to prevent cracking and damage to the semiconductor layer due to the explosive nature of the laser liftoff approach. Bonding is also required to maintain flatness due to the lattice mismatched that exists between the semiconductor layer and the non-native growth substrate.

The formation of localized stress features can be used to control the flatness of thin nitride layers. The spacing, geometry, direction relative to the crystal planes, and depth of these stress features determines the flatness of the layer. In this approach, stress features at typically separated spatially. The formation of stress features on the other side of the semiconducting layer is also disclosed. The localized nature of this approach can be additionally be used to separate semiconductor layers which do not exhibit absorption to the wavelength of the radiation used for separation. In this manner, semiconductor layers such as ALN, AlGaN (with high aluminum content) as well as other high bandgap materials can be separated from a substrate. This also allows for separation of semiconductor layers with nucleation layers transparent to the radiation being used. The localized nature of this approach can take advantage of the non-linear optical properties created at an epitaxial boundary.

Transparent nucleation layers exhibit index of refraction variation, including scatter, Fresnel reflections, non-linear index changes, and/or a combinations of these effects lead to localization of the energy from the radiation source. This technique is therefore not limited to semiconducting layers which exhibit absorption to the irradiating source as disclosed in the prior art. In the case of mechanical means and chemical etching means used to remove the non-native growth substrate, thin semiconductor layers still require bonding layers to maintain flatness due to the stresses created during growth of the layers.

A need exists for the development of techniques to form thin flat freestanding high crystal quality nitride layers such that heat can be removed from the junction as rapidly as possible. Methods to maintain/control flatness in thin semiconductor layer without additional thermal interfaces or support substrates are also needed. Thin semiconductor layers based on stress control features can be formed simultaneous with the separation of the semiconductor layer from its non-native substrate. This technique creates textured surfaces for enhanced optical, enhanced thermal extraction, and/or enhanced regrowth. This invention also discloses methods and articles that relate to using these thin nitride layers by themselves or in conjunction with other materials to form single sided, double sided and three-dimensional circuitry. Microchannels and other cooling means in at least one of the layers can extract heat efficiently. By manipulating the laser intensity profile and cutting pattern not only can optical, thermal cooling and regrowth features by created in the semiconducting layer but also very thin semiconducting layers can be separated without cracking.

These freestanding nitride layers enable a host of the devices ranging from but not limited to solar cells, LEDs, laser diodes, power switches, HEMTs, and other semiconducting devices. Due to the anisotropic nature of the nitride crystal structure, stress within the layer can have significant impact on the devices grown on the layer.

The present inventors have discovered that the spectral distribution of an unsupported LED is significantly different from the spectral distribution of the same die rigidly mounted. The ability to control the stress profiles within large area nitride devices is important to optimizing device performance and operational ranges. The formation of these thin semiconducting layers also eliminates the need for secondary removal of excess thickness via etching and or grinding as is required in the use of bulk nitride wafers. The ability to create epitaxial-ready thin nitride layers which do not required additional polishing steps has also been demonstrated using this technique by the present inventors and is an embodiment of this invention. These thin nitride layers can be used within multilayer packages with and without devices. These thin nitride layers can be used as heat spreaders, submounts, bimorphs, and structural elements within electronic, optical and optoelectronics packages.

In general, thin nitride layers can replace SiC, AlN, sapphire, alumina, beryllium oxide, metal composites, and other thermally conductive low thermal expansion materials due to its high thermal conductivity, low optical absorption, low coefficient of thermal expansion, chemical resistance, laser machinability, piezoelectric properties, non-linear optical properties, cleavability, bio-compatability as well as other physical properties. The overall intent of this invention is to disclose articles and methods that benefit/need the combination of material properties that nitrides provide.

SUMMARY OF THE INVENTION

This invention relates to the formation of thin flat crack-free freestanding nitride layers via laser patterning of the interface and/or opposing surface of the nitride layer such that once removed from the non-native substrate the nitride layer is substantially flat. Using the techniques disclosed in this invention, cost effective nitride layers can be fabricated. The use of these thin nitride layers in applications which take advantage of nitride properties including but not limited to high thermal conductivity, piezoelectric properties, bio-compatability, chemical resistance, laser machinability, cleavability, low coefficient of thermal expansion, low optical absorption, luminescent properties, as well as other physical properties is an embodiment of this invention. The ability to form thin freestanding nitride layers of high crystal quality in a cost effective manner requiring no additional thinning processes is disclosed. This technique can form nitride layers with controlled curvature. Even more preferably the formation of the nitride layers with controlled curvature for attachment to or incorporation into heatpipes is an embodiment of this invention.

This technique does not require waferbonding, heating, chemical etching, or other techniques to create the freestanding thin nitride layers. More preferably, the thin flat crack free nitride layers are between 3 and 250 microns thick. Also preferred is the formation of nitride layers exhibiting areas greater than 1 cm2.

This technique in conjunction with laser liftoff, waferbonding, heating, chemical etching, mechanical grinding, and other techniques as disclosed in the art can reduce stress and increase yield.

The enhancement or modification of spectral output of LED structures based on the use of freestanding nitride layers is also an embodiment of this invention. Even more preferably, these layers can form single sided, double sided, multilayer, and or 3 dimensional circuits. Regrowth of additional epitaxial layers on either or all surfaces is also an embodiment of this invention. Devices can be formed including but not limited to optical, electrical, optoelectronic, electromechanical and combinations of each on at least one thin nitride layer.

Vias formed by but not limited to etching, laser cutting, and mechanical means can connect nitride layers. The formation of micro channels within the thin nitride layers can permit cooling via air and/or liquid cooling means.

DETAILED DESCRIPTION OF THE INVENTION

Figure 1A:
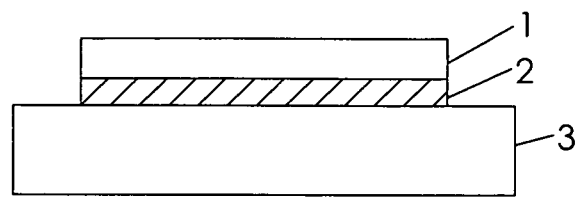
FIG. 1 depicts a thin GaN layer waferbonded and laser liftoff onto a silicon submount.
Figure 1B:
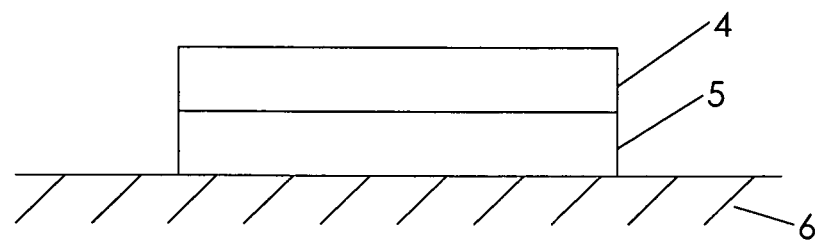

FIG. 1A depicts a typical waferbonded nitride device as seen in high powered LEDs. In this case, the nitride layer 1 typically contains a MQW structure and associated contact layers and metallizations as known in the art. The nitride layer 1 is attached via solder layer 2 to support 3, which is typically a thermally conductive material like silicon, germanium, or metal composites. The typical thickness of the nitride layer 1 is less than 3 microns and the nitride layer 1 lacks the mechanical integrity to be handled or processes without being attached to support 3. In addition, the stresses with the nitride layer 1 cause it to warp significantly if it were not attached to support 3. The thermal impedance through the solder layer 2 and support 3 determines the maximum power density of the device. Alternately FIG. 1B depicts a nitride layer 4 on growth substrate 5 which may consist of, but not limited to, SiC, diamond, sapphire, and glass. In these cases, a thermal boundary exists at the interface between nitride layer 4 and growth substrate 5. Even though the nitride layer 4 is epitaxially grown on growth substrate 5, a portion of the phonons transmitting the heat from the junction to the cooling means 6 are reflected back toward the junction within nitride layer 4. In addition, the strain and stresses induced during the growth of nitride layer 4 due the lattice mismatch with growth substrate 5 can not be controlled or modified.

Figure 2:
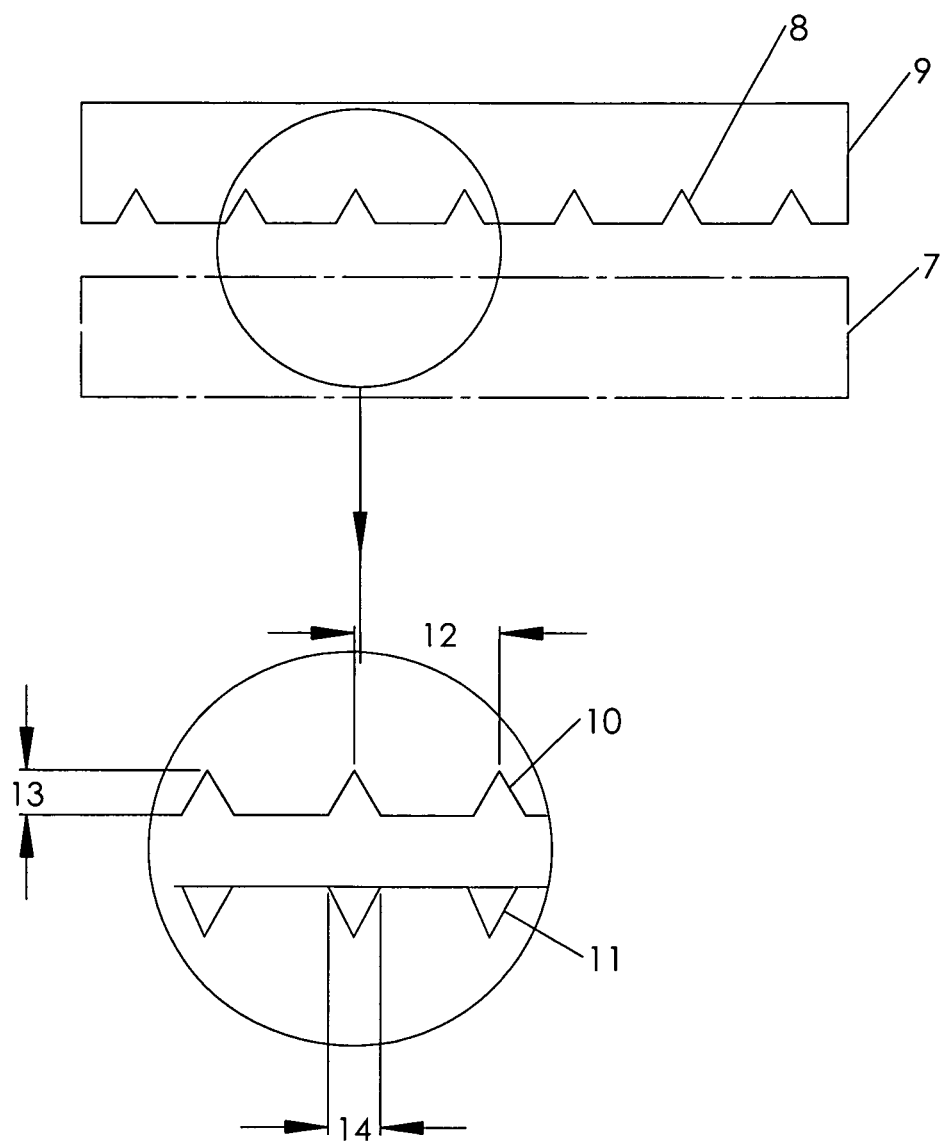
FIG. 2 depicts a thin GaN layer with stress control features formed on the epitaxial layer side of the thin GaN layer of the present invention.

FIG. 2 shows a nitride layer 9, which contains stress control features 8. These stress control features 8 are created at the interface between nitride layer 9 as it was separated from growth substrate 7 in a semiconductor structure device. Nitride layer 9 may be in the form of but not limited to tapes, fibers, ribbons, wafers, or foils. Growth substrate 7 may consist of but not limited to tapes, fibers, ribbons, wafers or foils of sapphire, glass or combinations of both. The use of composite tapes containing sapphire fibers within a glass matrix for growth substrate 7 is included as an embodiment. Nitride layer 9 is substantially single crystal in nature and may be composed of GaN, AlN, InGaN, InN, AlInN, AlGaN, BN, and dilute nitrides. Nitride layer 9 is substantially epitaxially grown on growth substrate 7. Highly focused laser radiation can create these features. An expanded view of the interface shows that expanded nitride feature 10 and growth substrate feature 11 are both formed using this approach. Even though the growth substrate 7 is transparent to the radiation spectrum, some material removal occurs from growth substrate 7. In the case of nitride layer 9, even expanded nitride feature 10 can be formed in AlN which has little to no absorption to the radiation spectrum. Depending on the spacing and depth of expanded nitride feature 10, the nitride layer 9 can be removed or remain on the growth substrate 7.

Spacing, size, orientation to crystal planes, and density of the stress control features 8 can be used to control the flatness of the nitride layer 9. These parameters can also be used to determine whether nitride layer 9 separates fully or partially from growth substrate 7. The use of these parameters controls stress and separation either separately or simultaneously. The non-linear optical response of the interface between growth substrate 7 and nitride layer 9 to laser radiation for which neither element exhibits significant absorption to the laser radiation spectrum is also an embodiment of this invention.

The use of spacing, depth, size and orientation of stress control features 8 causes separation without feature overlap. The resulting nitride layer 9 containing stress control features 8 consist of features separated by feature spacing distance 12 where feature spacing distance 12 is greater than the width of the feature 14. More preferably nitride layers 9 feature spacing distance 12 between 1 micron and 100 microns. The width of the feature 14 is between 1 micron and 50 microns. The ratio of feature depth 13 to width of the feature 14 is greater than 0.1. Variable spacing is used for stress control features 8. Additive approaches in which multiple exposures using the same or different orientations of laser exposure form stress control features 8.

Figure 3:
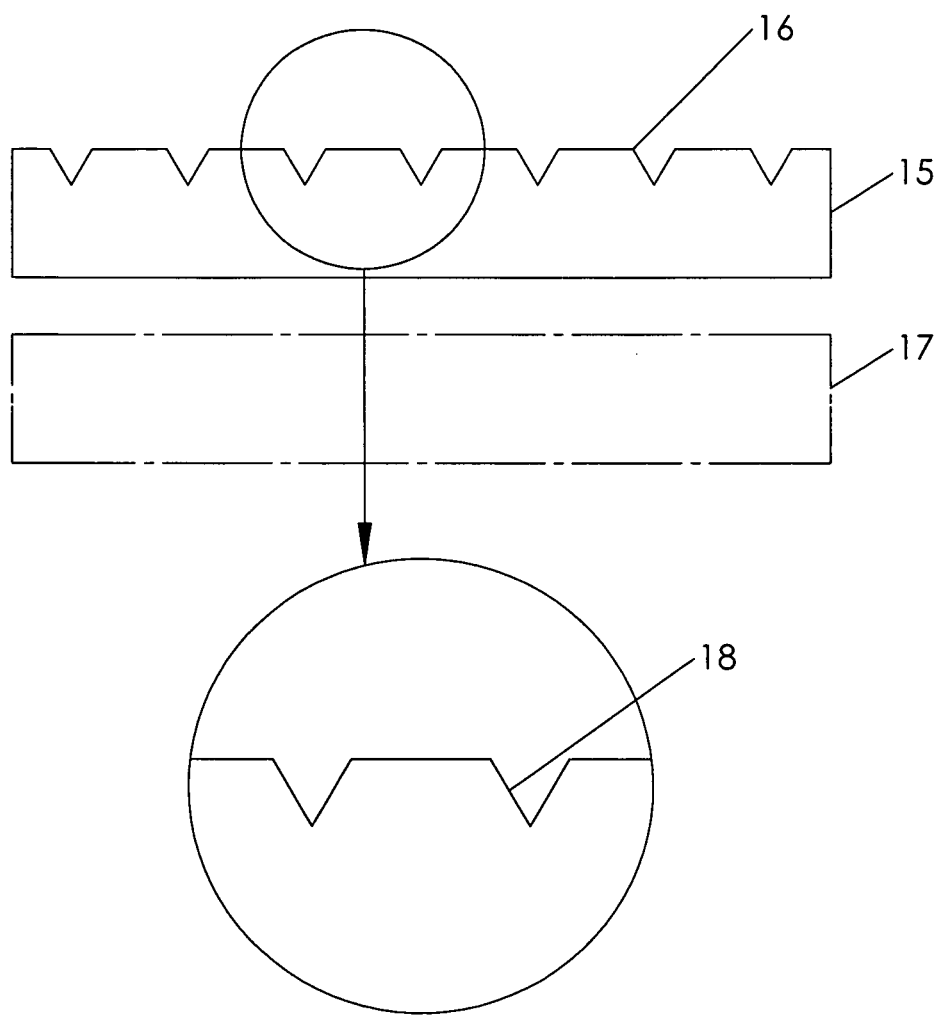
FIG. 3 depicts a thin GaN layer with stress control features formed on the outside surface of the thin GaN layer of the present invention.

FIG. 3 depicts the formation of stress control features 16 on nitride layer 15. The stress control features 16 can be formed prior to or after separation from growth substrate 17. Cleaning steps including, but not limited to, plasma, chemical etching, evaporation, and mechanical means remove excess metals. Laser scribing methods define the outer dimension of the nitride layer 15. Expanded feature 18 illustrates a typical stress control feature. Alternately, the high aspect ratio of created using techniques like laser ablation can create high aspect ratio features that are particularly advantageous to regrowth processes. Addition, etching via photochemical, chemical, or mechanical means can allow for improved regrowth. The dual usage of stress control features 16 as stress control and regrowth sites is an embodiment of this invention. More preferably the use of a dense array of high aspect ratio stress control features 16 in conjunction with regrowth conditions which preferentially favor lateral growth is preferred. The use of sacrificial coatings such as SiO2 prior to formation of stress control features 16 to further encourage lateral growth on coalescence on a micron scale is even more preferred. The resulting nitride layer 15 is an embodiment of this invention.

More preferably, the formation of non-circular shapes is preferred. The usage of non-circular shapes increases the fill ratio and/or usable nitride layer 15 area in subsequent growth and processing stages. Even more preferably, the formation of nitride layer 15 as a square or rectangular area with a dimension equivalent to a multiple of the individual die being fabricated (e.g. 1 mm×1 mm LEDs) maximizes the amount of useful area. In general, tapes, fibers, foils, wafers, and ribbons are used. The formation of retaining features, either internal to perimeter of nitride layer 15 or along the perimeter to of nitride layer 15, support, suspend, align and/or contain the nitride layer 15 during subsequent regrowth and processing. Because the only constraint of shape and features in the nitride layer 15 is based on the resolution of the laser scribing equipment, the need to make round wafers is removed. Unlike boule based processes such as silicon where the wafers are formed from cylindrical boules, circular wafers are not required or preferred. In the same manner that polycrystalline solar cells have moved away from wafer based processing, this technique enables the formation of a variety of form factors for enhanced yield and functionality. This aspect is especially important with regard to the use of nitride layer 15 as a circuit layer where edge alignment for registration between layers or photomasks is typically required or desired. The use of non-circular nitride layer 15 for alignment and registration means forms single layered or multilayered circuits.

Figure 4A:
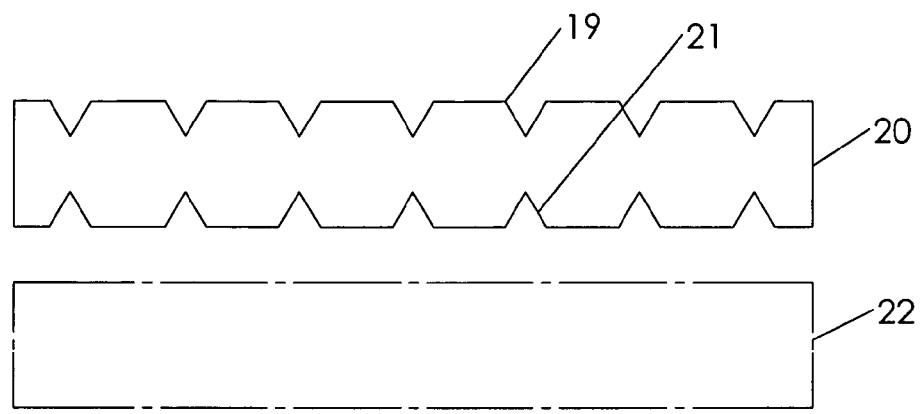
FIG. 4 depicts a thin GaN layer with stress control features formed on both sides of the thin GaN layer of the present invention.
Figure 4B:
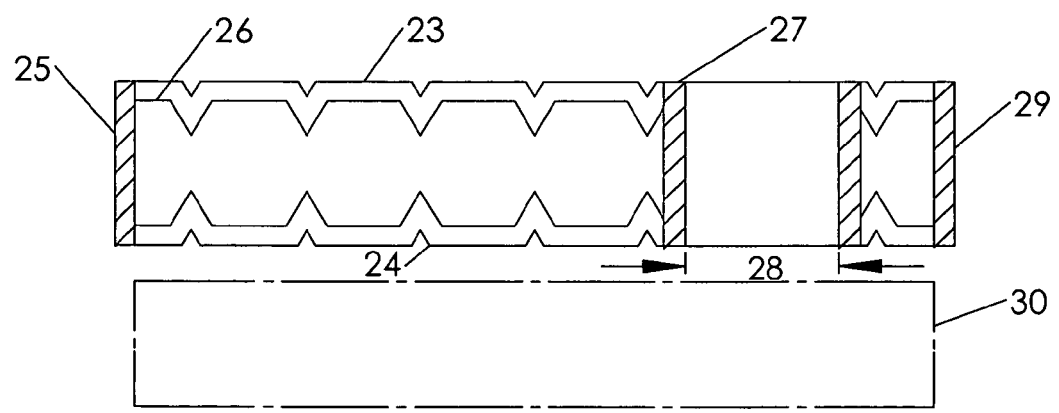

FIG. 4A depicts a nitride layer 20 in which stress control features 19 and 21 have been formed both sides of nitride layer 20. The formation of stress control features 19 and/or 21 can be prior to, simultaneous to, and/or after removal of growth substrate 22. The orientation, density, shape, orientation to crystal planes and depth of stress control features 19 and/or 21 can be similar, different, or the same so as to control the flatness, regrowth conditions, thermal cooling or extraction efficiency of the nitride layer 20. FIG. 4B depicts nitride layer 26 with top layer 23, outer edge layers 29 and 25, bottom layer 24 and via feedthru layer 27. In a manner similar to a printed circuit board, it is an embodiment of this invention that nitride layer 26 be used as a circuit substrate.

The formation of vias, feedthrus, and other interconnect means are an embodiment of this invention. As such the use of semi-insulating, insulating, doped and layered growths for the nitride layer 26 is an embodiment of this invention. Top layer 23 and bottom layer 24 include but are not limited to transparent conductive oxides, dielectrics, and conductors. The use of these layers and vias interconnects devices created via standard semiconducting means on nitride layer 26 either subsequent to separation from growth substrate 30 or after separation. In this manner multiple levels of interconnect and device structure can be created on a single nitride layer 26. As an example, MQW LEDs and their associated drive elements might be formed while the nitride layer 26 is still attached to growth substrate 30 using MOCVD growth and photolithography and etching processes as known in the art. After separation from growth substrate 30, the use of printing, additive and subtract methods, and photolithographic means to form interconnect, resistors might be used to connect the functional devices formed during the initial processing. In this manner, steps requiring high temperature processing and high resolution lithography could be performed on a wafer level while the low resolution and/or low temperature steps could be perform on the nitride layer 26. This approach could be used to increase yield, enable the use of high current interconnect via thick film processing, allow for an intermediate testing step, and the use of materials not compatible with standard wafer processing.

Alternately, the high temperature capability of the nitride layer 26 enables the use of high temperature thick film processing. The chemical resistance of the nitride layer 26 allows for the use of a variety of chemical treatments that may or may not be compatible with the growth substrate 30 including but not limited to electroplating, chemical etching, anodizing, plasma spray, spin coating, and spray coating. These techniques, either singularly or with another step, can form a circuit using the nitride layer 26. The use of the high thermal conductivity of the nitride layer 26 forms a thermally conductive core either locally within a printed circuit board or flex circuit. The nitride layer 26 can contain semiconductor devices embedded, laminated to, or attached via mechanical means such that connection is made to the semiconductor devices formed on nitride layer 26. The growth of devices including MQWs, 2DEGs, SQWs, DHJ, HEMTs, SHJ, PN, and other semiconductor and optoelectronic structures as known in the art on either the nitride layer 26 by itself or the nitride layer 26 on growth substrate 30 is an embodiment of this invention. Even more preferably, the nitride layer 26 can be embedded within an optical interconnect laminate in which the nitride layer 26 contains at least one laser diode.

The cleavable nature of the nitride layer 26 can form at least one facet of the laser diode. Because nitrides can not only be used to form emitting devices such as LEDs, EELEDs, and laser diodes, but also operate at very high frequencies and power levels, they are ideally suited for use in optical interconnects and other optoelectronic applications. The ability to integrate multiple devices within the nitride layer 26 is an embodiment of this invention. The use of epitaxial layers which exhibit tensile or compressive stress for either and/or both top layer 23 and bottom layer 24 can act as compensation layers to control flatness of nitride layer 26. The use of amorphous or polycrystalline layers can control the flatness for either and/or both top layer 23 and bottom layer 24 as compensation layers to control flatness of nitride layer 26. The combination of these approaches with stress control features is an embodiment of this invention.

Figure 5:
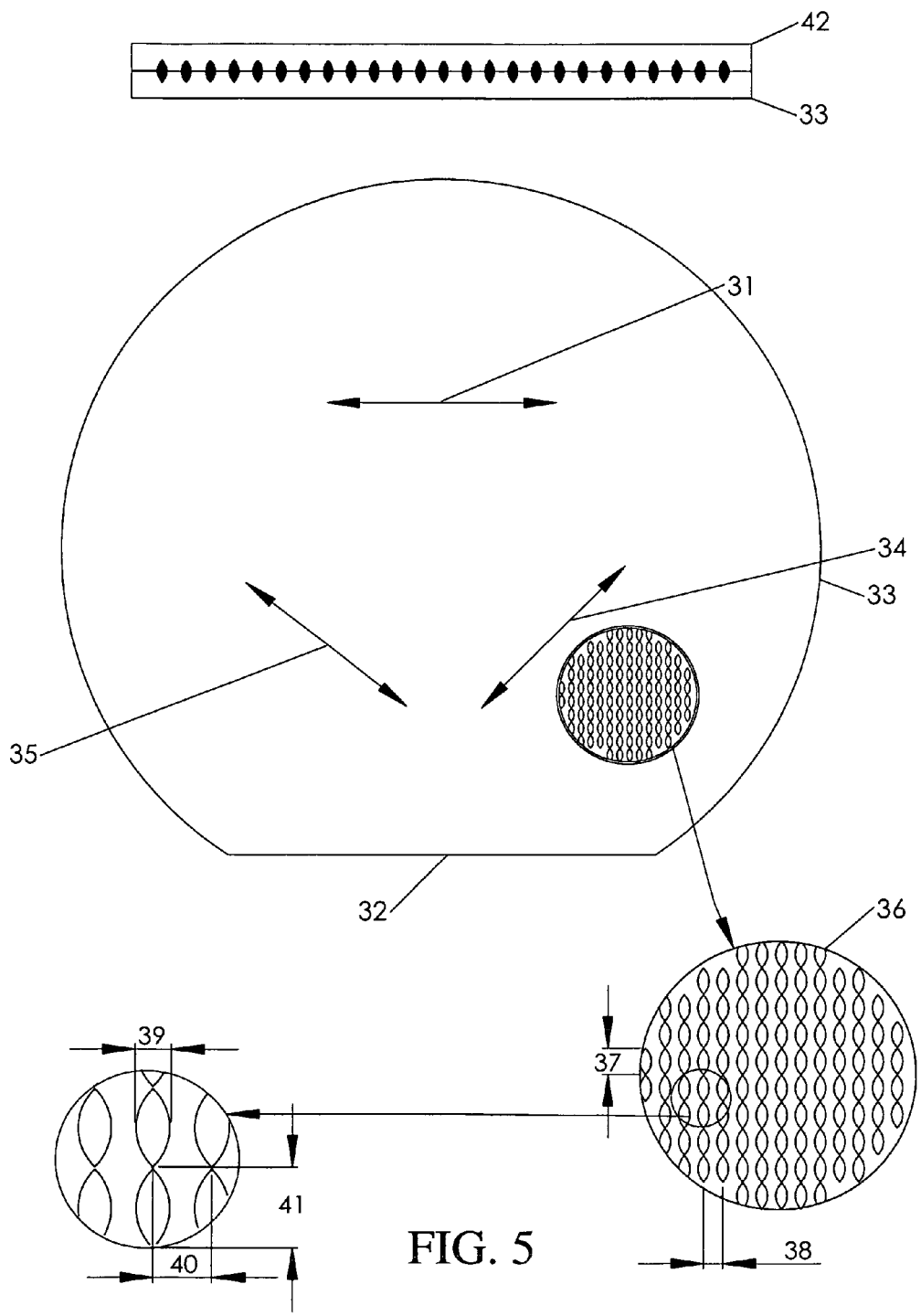
FIG. 5 depicts the geometry, spacing, direction relative to crystal planes, and depth of the stress control features of the present invention.

FIG. 5 depicts an illustration of stress control features 36 formed into wafer 33 on which a nitride layer 42 is epitaxial grown via but not limited to HYPE, MOCVD, MBE, LPE and HPHT methods as known in the art. Most preferably, nitride layer 42 is grown via HVPE due to low cost and high crystal quality. Even more preferably, nitride layer 42 is grown via HVPE with an average absorption coefficient less than 1 cm−1 over the emission range of the optoelectronic devices being formed on nitride layer 42.

The use of stress control feature 36 can enhance light extraction, suppress unwanted optical modes, reduce dislocations during subsequent regrowth as well as control flatness of nitride layer 42. Stress control features 36 may be a variety of shapes and sizes. Most preferably, a narrow line source laser is used is create a small feature size relative to the thickness of nitride layer 42. In this manner, localized stresses created at the interface between growth substrate 33 and nitride layer 42 during cutting will not exceed the fracture point of the layer. Unlike the large area excimer approaches, this approach gently fractures the interface without the need for waferbonding. The use of a narrow line source with dimensions on the order of 3 microns by 300 microns is used to create these features. The use of DPSS lasers is preferred due to the high rep rate of the pulses such that high scan rates can be used such that individual laser pulses can be used to form the stress control features 36. Typical feature sizes are depicted in the expanded view. In this case, a typical dimension for feature waist 39 is less than 10 microns, while feature length 41 is greater than 20 microns. The feature spacing 40 is typically greater than the feature waist 39. The use of alternate feature shapes and sizes as required can control flatness.

Stress control features 36 may be oriented and spaced randomly or based on a regular pattern. Alignment of surface control feature 36 to crystal planes 35, 34 or 31 are embodiments of this invention. Since the effect of stress control features 36 are additive, the use of multiple scans is an embodiment of this invention. The use of refocusing algorithms during a particular scan can deal with warpage in the initial wafer created by the lattice mismatch between growth substrate 33 and nitride layer 42. The use of mechanical means can flatten the initial wafer to deal with warpage so that the laser intensity profile at the interface between nitride layer 42 and growth substrate 33 is not changing significantly across the wafer. The edge supports can be used such that the nitride layer 42 can separate freely from growth substrate 33 during exposure. The use of porous media such as filter paper, porous ceramic, porous glass and other porous media can allow for temporary vacuum hold-down of the initial wafer during laser processing. The use of laser scribing can separate nitride layer 42 either while it is attached to growth substrate 33 or after nitride layer 42 is freestanding to form shapes. Most preferably, the formation of non-circular shapes can allow for maximum utilization of equipment space in subsequent processing steps including but not limited to reactors, plasma chambers, deposition equipment, test equipment and pick and place equipment. The ability to create non-circular high quality freestanding nitride layers 42 is a preferred embodiment of this invention. For the cases where stress control features 36 are used in both sides of nitride layer 42, the orientation of the these features to each other can be used to control the flatness or curvature of the nitride layer.

Figure 6A:
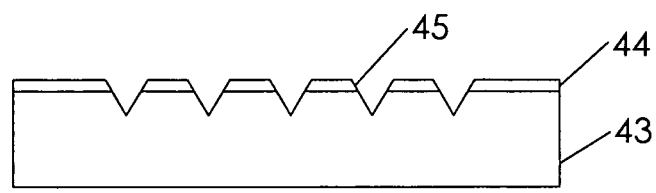
FIG. 6 depicts lateral epitaxial overgrowth based on sacrificial layers incorporated into stress control features of the present invention.

FIG. 6A depicts the formation of regrowth features in nitride layer 43. The laser cutting techniques used to create the stress control features as disclosed previously can also be used to create high aspect ratio features 45 for regrowth methods such as lateral overgrowth. Typically these features are defined by anisotropic etching of crystal planes. By using the laser scanning technique, micron sized high aspect features can be formed without the need for masking. A sacrificial layer 44 may be added to further enhance the lateral growth from these high aspect ratio features. Because etching techniques are not required, a wide range of sacrificial layer materials may be used including but not limited to silicon, SiO2, luminescent materials, metals, and transparent conductive oxides. The use of these materials and this technique to form higher crystal quality material within at least a region of the nitride layer 43 is an embodiment of this invention.

Figure 6B:
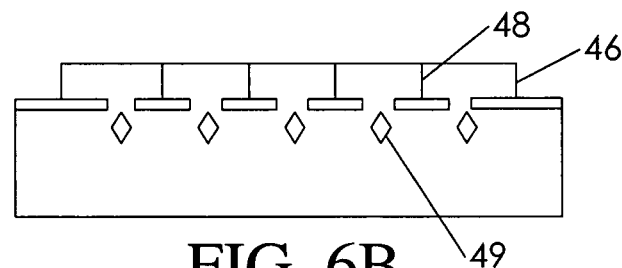
Figure 6C:
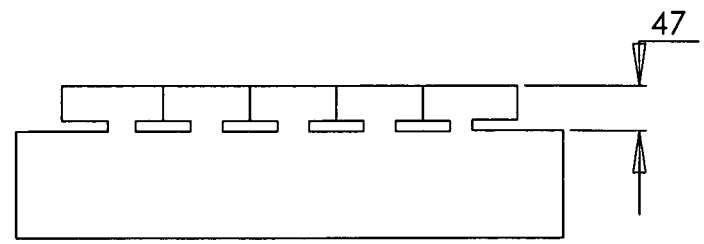

FIG. 6B depicts the typical regrowth structure 46 seen in lateral overgrowth. This typically includes coalescence regions 48 and 49. FIG. 6C depicts removal of sacrificial layer 44 and the resulting raised region 47 on nitride layer 43. In this manner, multiple levels can be formed additively on nitride layer 43 for 3 dimensional circuitry, mechanical features, and cooling channels. The use of this additive approach can create features on the nitride layer 43. Even more preferably, the use of this technique can form micro cooling features such a micro fins, microchannels, and/or increased surface area for impingement cooling techniques. The use of this technique can form mechanical features for fiber alignment, raised pedestals, self alignment features and/or interlocking features. In general the use of patterned regrowth to create features on the nitride layer 44 is an embodiment of this invention. Orientation of these features to crystal planes such that cleaving can be used to create optically smooth surfaces is also an embodiment of this invention. The use of embedded coalescence regions 49 can form channels for liquid cooling locally on nitride layer 43.

Figure 7A:
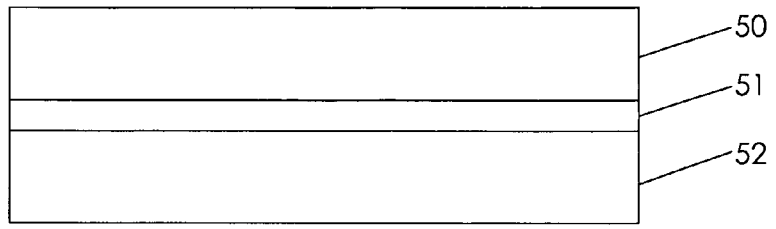
FIG. 7 depicts a thin transparent nucleation layer exhibiting non-linear response to the irradiation and its effect on the formation of the stress control feature of the present invention.
Figures 7B, 7C, 7D:
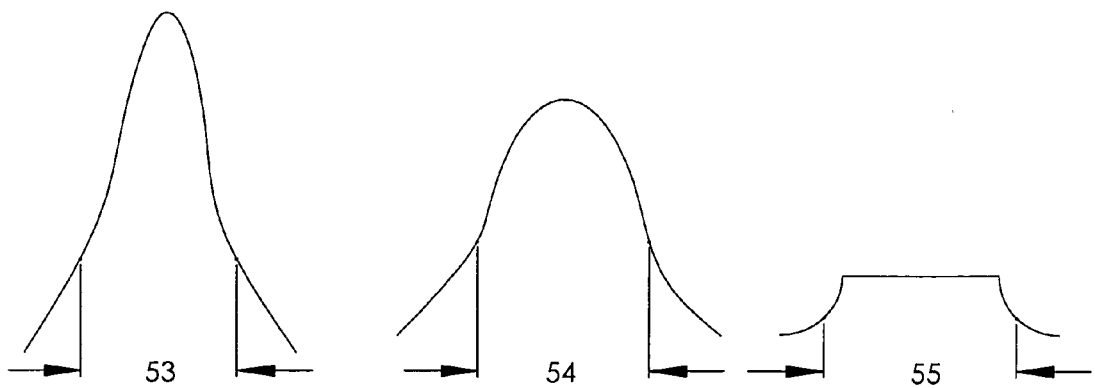

FIG. 7A depicts growth substrate 52 with nucleation layer 51 and nitride layer 50. Nucleation layer 51 is typically a region of reduced crystal quality. A variety of techniques and resulting layer characteristics are used depending on the particular supplier of these layers. GaN, AlGaN, AlN, CrN, and ZrBr2 have been reported in the literature. Some exhibit absorption to the typical laser radiation used in laser liftoff, some do not. FIGS. 7B, C, and D depict laser beam profiles with widths 53, 54, and 55 that can be used to create feature profiles. Shaping of these profiles 3 dimensionally is used to create feature shapes within the layers depicted in FIG. 7A. Preferably FIG. 7B is used for maximum cut depth in the layers.

Figure 8:
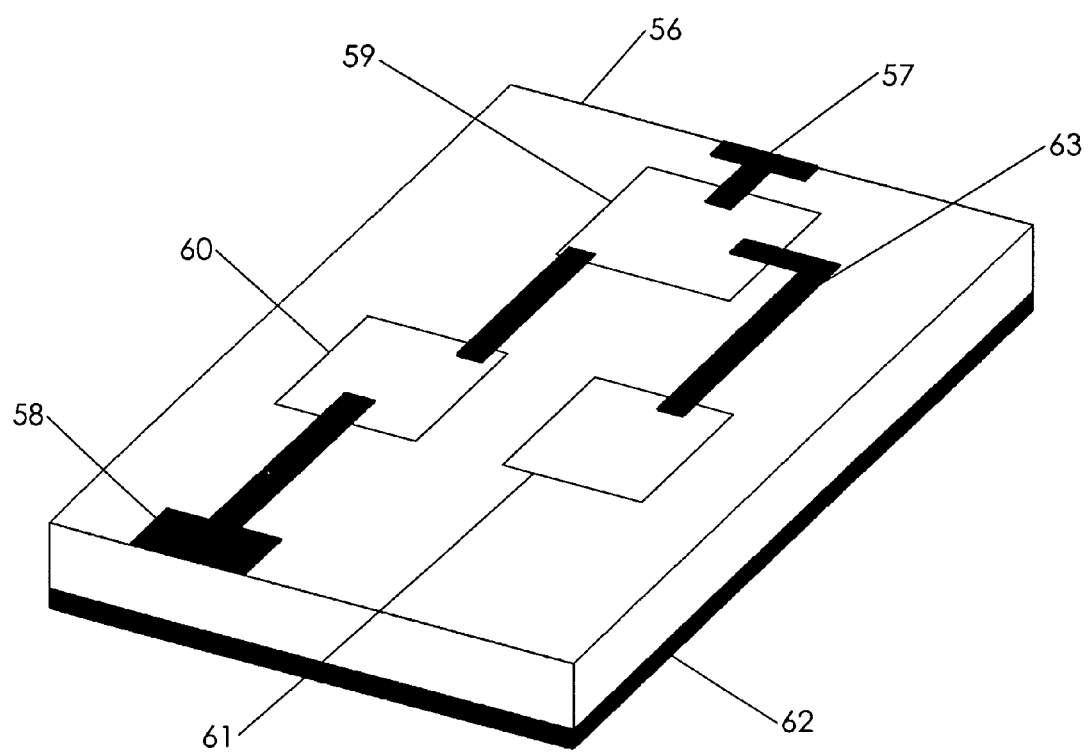
FIG. 8 depicts a single sided circuit formed on a thin nitride layer of the present invention.

FIG. 8 depicts nitride layer 56 containing devices 59, 60 and 61, electrical top contacts 57 and 58, and electrical bottom contacts 62. Devices 59, 60, and 61 may consist of, but not limited, to passive and active electrical elements such as resistors, capacitors, diodes, and transistors, optoelectronic elements such as LEDS, laser diodes, and tunable gratings, and mechanical elements like MEMS. Interconnect 63 can include metals, transparent conductive oxides and combinations of both. The use of conductive polymers is also embodiments of this invention. These devices may be integrated prior to removal of the growth substrate or once the nitride layer is freestanding. The use of doped, undoped, layered, or insulating nitride layer 56 can form at least one electrical bottom contact 62 either due to the conductive nature of the material or by the formation of via as described earlier. Devices 59, 60, and 61 can be formed on, printed on, solder onto, glued onto and/or attached via mechanical means to nitride layer 56. Top contacts 58 and 57 and bottom contact 62 may be connected to external connections via but not limited to mechanical contacts, wirebonding, flipchip, soldering, and conductive pastes.

Figure 9:
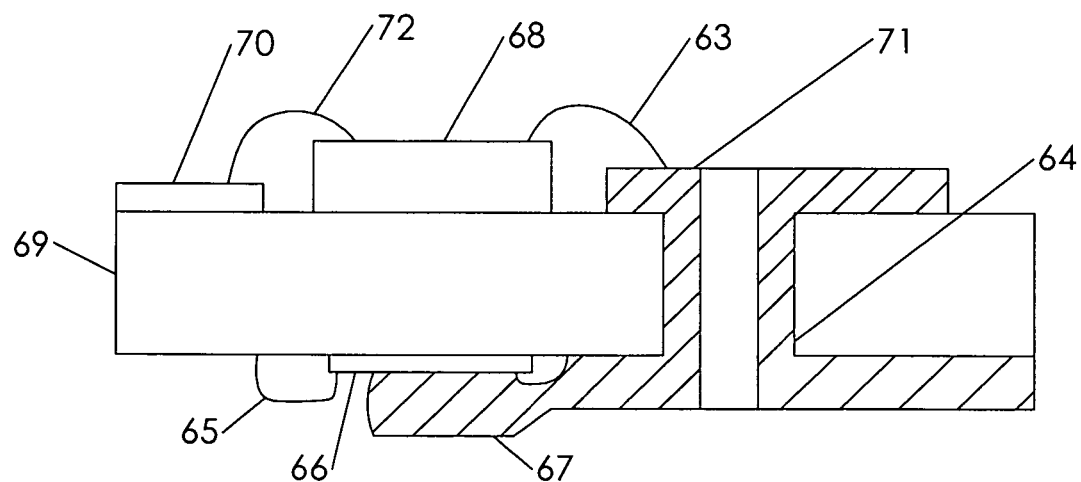
FIG. 9 depicts a double sided circuit formed on a thin nitride layer of the present invention.

FIG. 9 depicts a double sided circuit on nitride layer 69. Connection between the top and bottom of nitride layer 69 is through via 64 which may be made by, but not limited to, laser ablation, etching, drilling, and sandblasting. Device 68 is mounted adhesively to nitride layer 69 and interconnected to interconnect 70 and 71 via wirebond 63 and 72. Device 66 is formed directly on nitride layer 69 using additive processes described earlier. Passivation layer 65 is used to isolate regions of device 66 and allow for use of printed interconnect 67 to be used.

Figure 10:
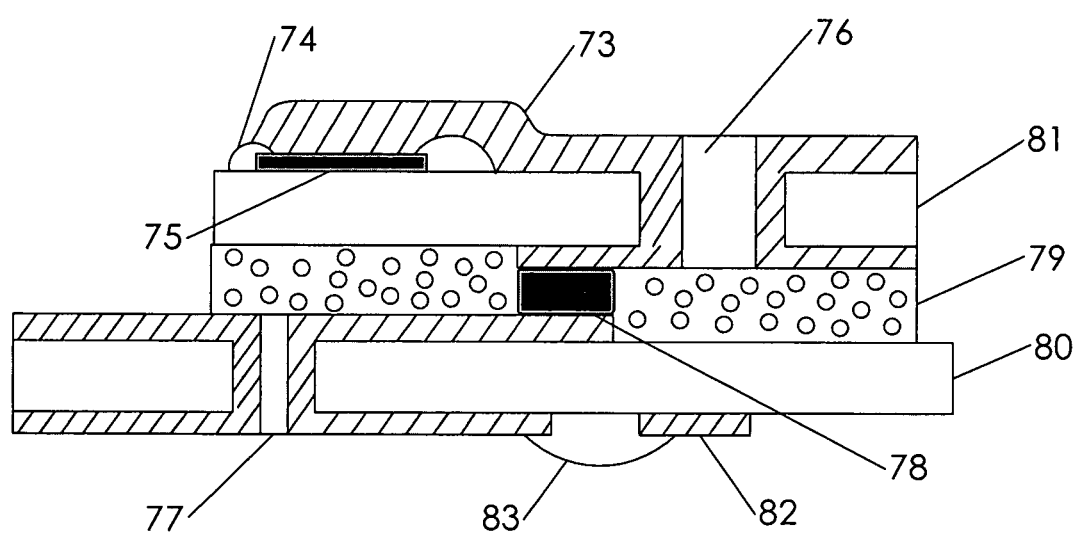
FIG. 10 depicts a multi-layer circuit formed via multiple thin nitride layers of the present invention.

FIG. 10 depicts a multilayered assembly on nitride layers 80 and 81. Bondply 79 is used to bond nitride layers 80 and 81 together. Interconnect between nitride layers 80 and 81 is via bondply contact 78 which may consist of, but not limited to, conductive inks, solder, phase change materials and mechanical contacts. Bondply 79 may consist of, but not limited to, organic and inorganic adhesives. Devices 82 and 75 are connected in a manner similar to the previous figure using interconnect means 83 and 73. Isolation means 74 may also be used to prevent shorting.

Figure 11:
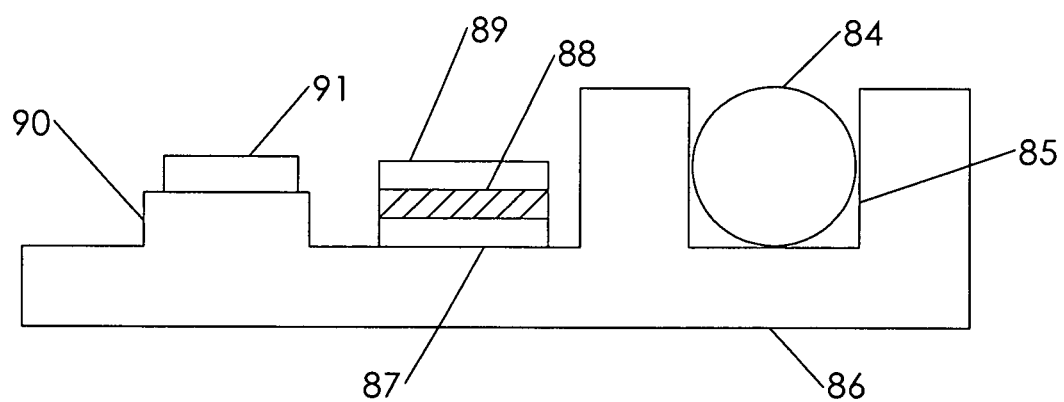
FIG. 11 depicts a 3 dimensional circuit formed on at least one thin nitride layer of the present invention.

FIG. 11 depicts 3 dimensional elements on a nitride layer 86. Alignment features position ball lens 84, while spacer 87 and bondply layer 88 are used to position crystal 89. Pedestal 90 is formed as described earlier positions laser diode 91, which was grown epitaxial directly on the pedestal 90. The use of these techniques to form 3 dimensional features in or on the nitride layer 86 is an embodiment of this invention.

Figure 12:
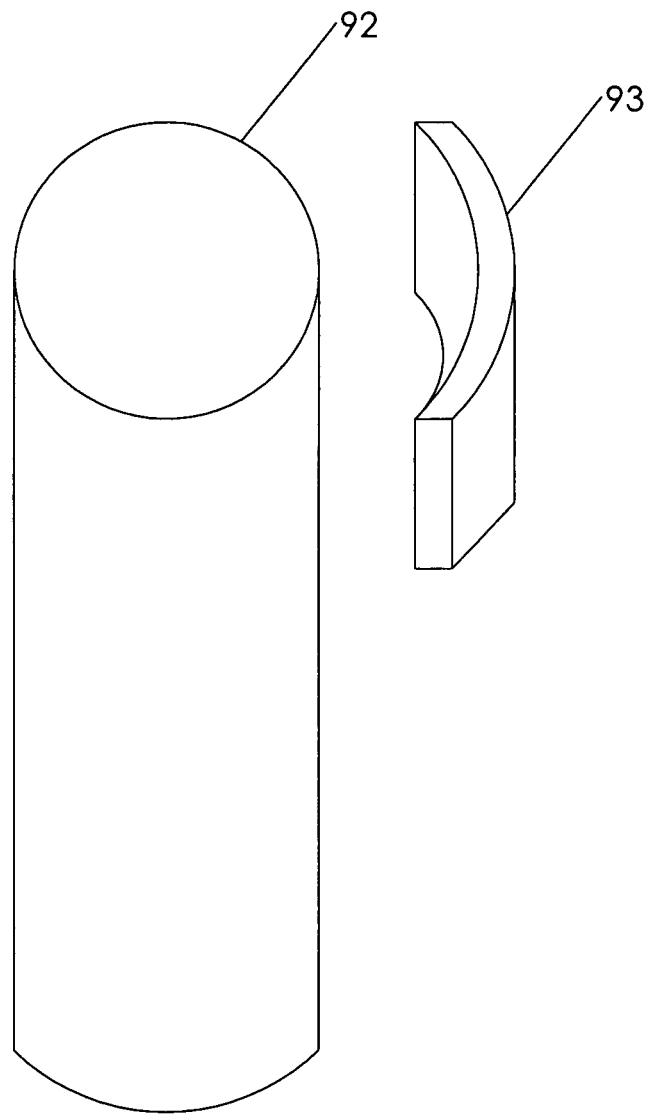
FIG. 12 depicts a thin nitride layer curved in one axis and its use with a heatpipe of the present invention.

FIG. 12 depicts cooling means 92, which may include, but is not limited to, heatpipes, conductive rods, and water pipes. Nitride layer 93 may be formed into a matching curvature using stress control features discussed earlier. The use of bonding materials including but not limited to conductive adhesives, solder, and mechanical means is an embodiment of this invention.

Figure 13:
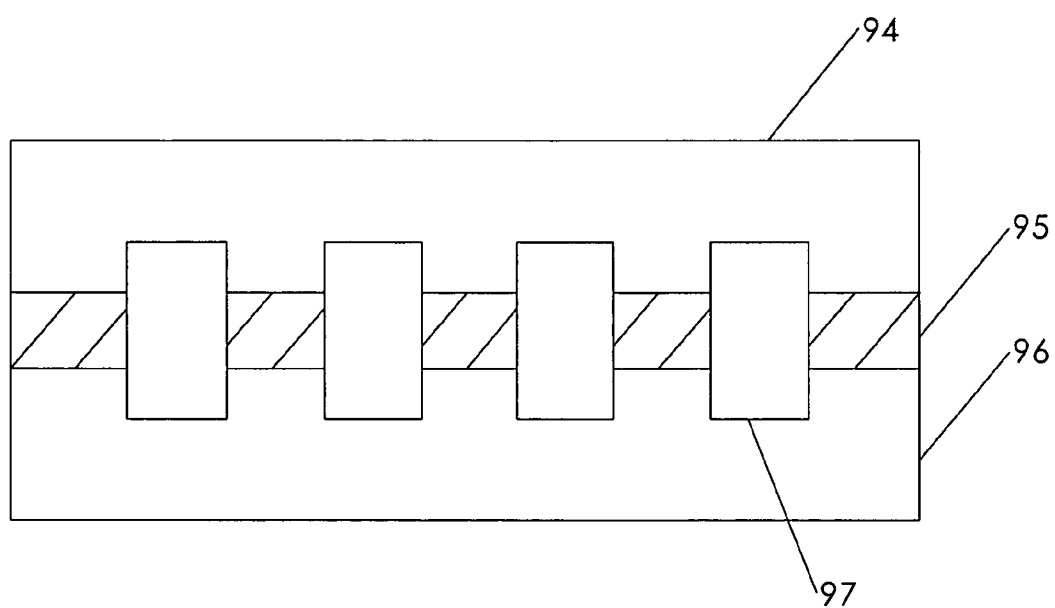
FIG. 13 depicts a multilayered circuit with integrated microchannels for cooling of the present invention.

FIG. 13 depicts nitride layers 94 and 96, which have been textured as described earlier to form channels 97. Nitride layers 94 and 96 are adhered together using bondply 95. The use of channels 97 to flow cooling material including, but not limited to, air and liquids is an embodiment of this invention.

Figure 14:
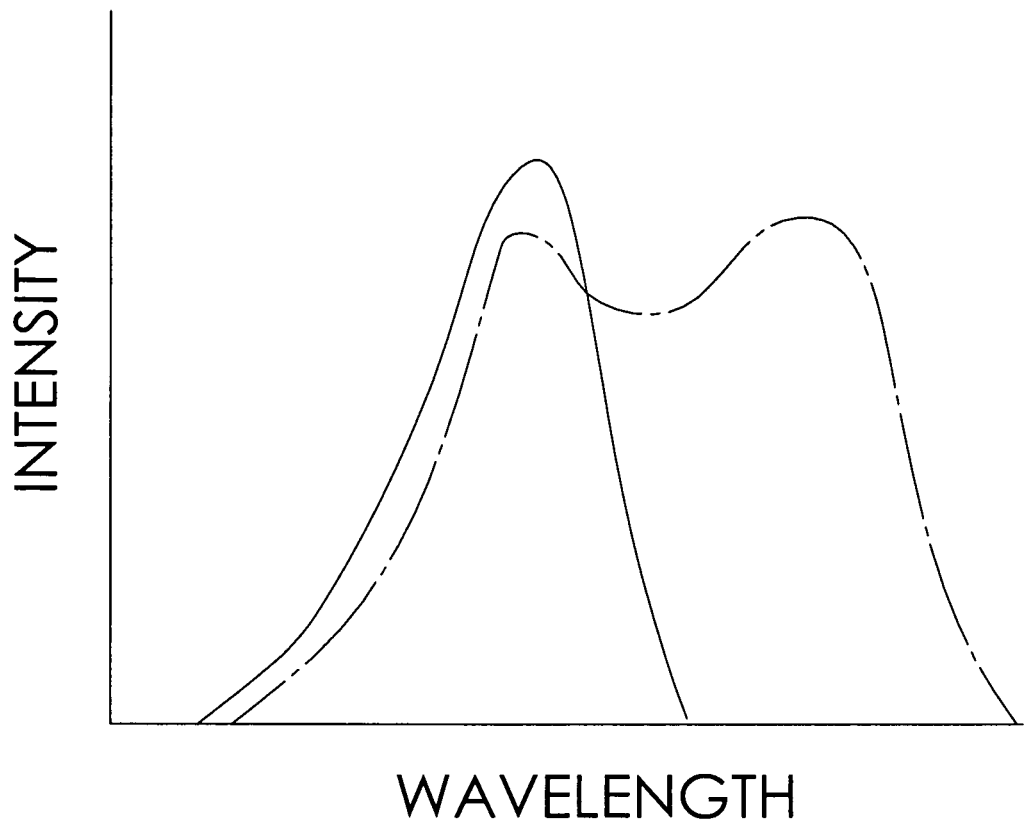
FIG. 14 depicts the spectral output of a freestanding UV led versus a mounted UV LED of the present invention.

FIG. 14 depicts the effect on the output spectrum of a UV heterojunction LED mounted 98 and unmounted 99. The die were identical with the exception of their mounting configuration. The change in spectrum is associated with the unconstrained nature of the unmounted LED. The absence of a non-native growth substrate and the lower stress nature of the flexible nitride layer used to form this LED is believed to be the main reason for the change in spectral output between the two cases. The exact mechanism for this effect is unknown, but because nitrides are highly anisotropic, the internal piezoelectric fields within the devices are believed to play a significant role in a wide range of device performance properties, including but not limited to spectrum, current induced droop, internal quantum efficiency and voltage characteristics. This is the first demonstration of spectral splitting based on the stress experienced by the device. As such, an unconstrained nitride device is disclosed. Immersion and impingement cooling via gases and liquids as known in the art is anticipated as a means forming practical devices which are unconstrained.

Figure 15A:
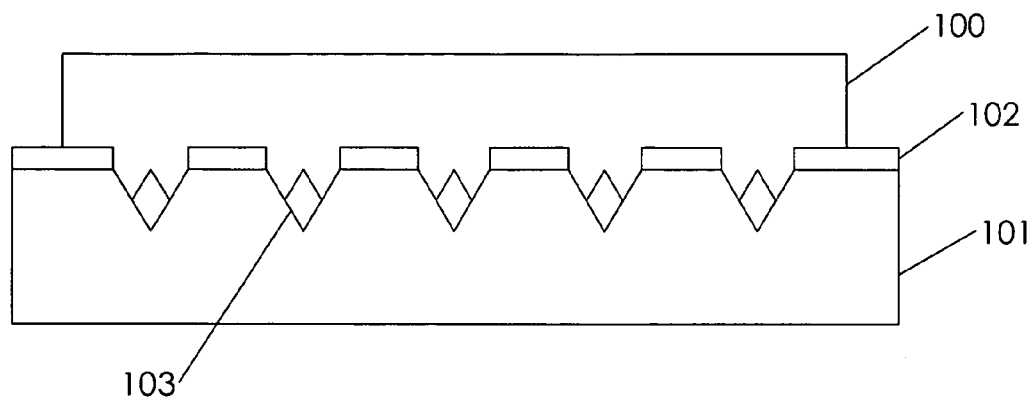
FIG. 15 depicts at least one regrowth layer on a freestanding textured thin nitride layer of the present invention.
Figure 15B:
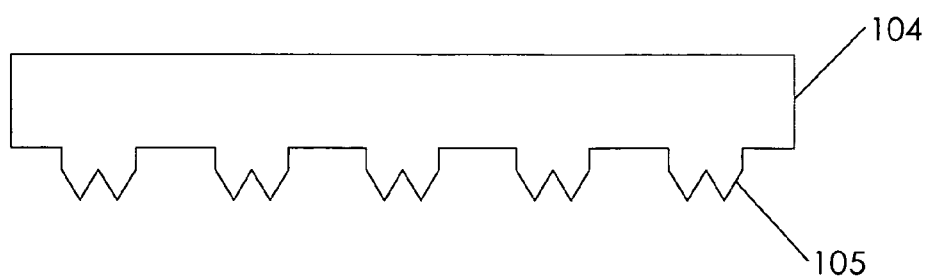

FIG. 15A depicts the regrowth of another nitride layer 100 on a nitride layer 101. The freestanding flexible nature of nitride layer 101 leads to lower stress within nitride layer 101, which in turns leads to higher crystal quality in another nitride layer 100. The use of sacrificial layer 102 can enhance lateral overgrowth as disclosed earlier. Voids 103 may be present based on the aspect ratio of the stress control features used. FIG. 15B depicts the removal of nitride layer 101 and sacrificial layer 102 to form another nitride layer 100. Separation means include, but are not limited to thermal shock, chemical etching, ultrasonics, and laser ablation. Even more preferably, the use of the resulting features 105 for optical extraction is an embodiment of this invention. In this manner a freestanding higher crystal quality nitride layer 104 can be formed. The use of this technique can form high quality AlGaN, InGaN, InN, InGaAlN, AlInN, and AlN layers. High crystal quality high indium content nitride alloys in particular are difficult to grow using conventional substrates. The improved lattice match and flexible nature of nitride layer 101 can be used to grow higher quality nitride alloys. The formation of devices including, but not limited to, LEDs, laser diodes, diodes, EELEDs, VCSELs, and semiconductor devices while another nitride layer 100 is attached to nitride layer 101 or as freestanding higher crystal quality nitride layer 104 is an embodiment of this invention.

Figure 16:
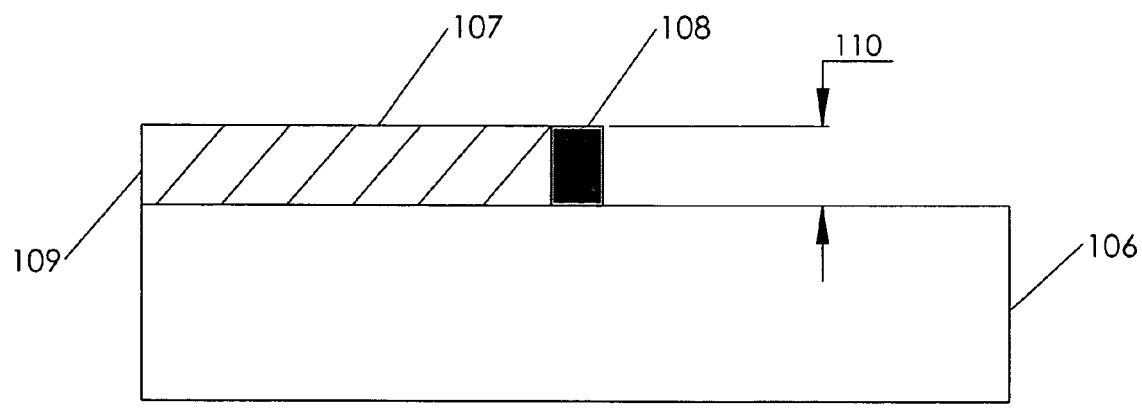
FIG. 16 depicts a laser diode with a cleaved edge formed on a thin nitride layer of the present invention.

FIG. 16 depicts the formation of a laser diode or EELED 107 in nitride layer 106. Rear reflector 108 can be deposited attached on step 110 formed as discussed earlier. Partial mirror 109 is formed by cleaving nitride layer 106. The use of subsequent coatings can enhance the reflectivity of partial mirror 109. The optical transparency of nitrides and the use of alloys creates confinement channels as known in the art. Higher crystal quality regions are formed on the nitride layer 106 due to regrowth, reduced stress, and homoepitaxial growth. The absence of thermal boundary layers using this approach is also an embodiment of this invention. Thermal conductivity is enhanced with this approach.

Figure 17:
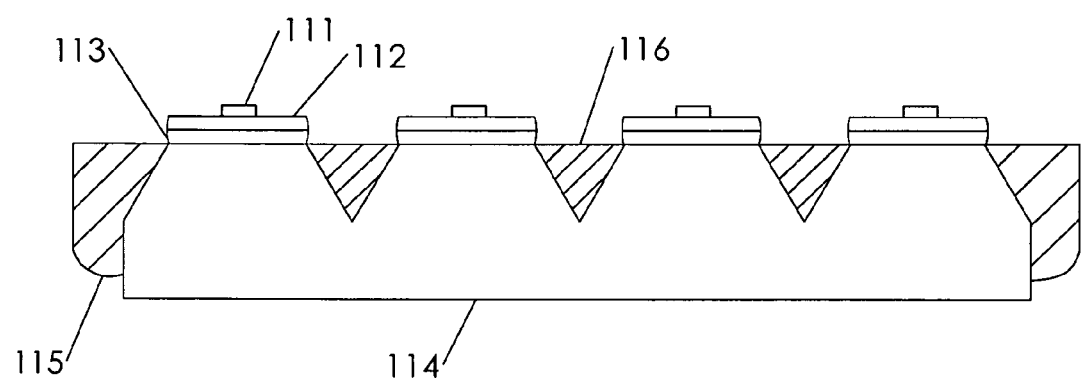
FIG. 17 depicts an array of LEDs formed on a thin nitride layer of the present invention.

FIG. 17 depicts an array LEDs or VCSELs formed on nitride layer 114. In the case of LEDs top metal contact 111, top contact layer 112, active region 113 are isolated via mesa formation which may be formed via but not limited to lithography and etching means, laser patterning and mechanical scribing. The use of laser patterning is preferred. For large area arrays current spreading layers 116 may be used. This embedded grid work of metals contacts can be connected to outer contact 115 by forming a grid pattern that extends outward to perimeter of nitride layer 114. The use of electroplating can form current spreading layer 116.

Figure 18:
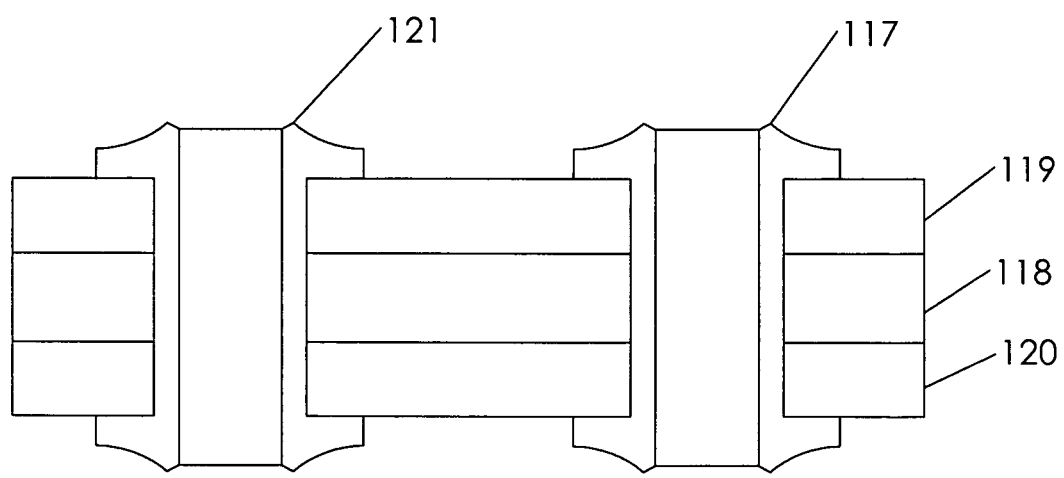
FIG. 18 depicts a solar cell and light source formed on two sides of a thin nitride layer of the present invention.

FIG. 18 depicts a solar cell layer 119 deposited, adhesively attached, soldered, grown, or mechanically fastened to nitride layer 118. The other side of nitride 118 is LED layer 120 which is deposited, adhesively attached, soldered, grown or mechanically fastened to nitride layer 118. Charge created by irradiation of solar cell layer 119 is transferred via feedthrus 121 and 117. The formation of additional elements in nitride layer 118 can store, convert, monitor, and block the charge from solar cell layer 119 to LED layer 120.

Figure 19A:
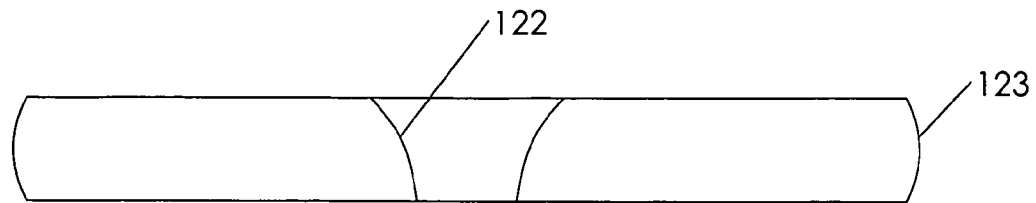
FIG. 19 depicts laser cut vias formed in a thin nitride layer of the present invention.
Figure 19B:
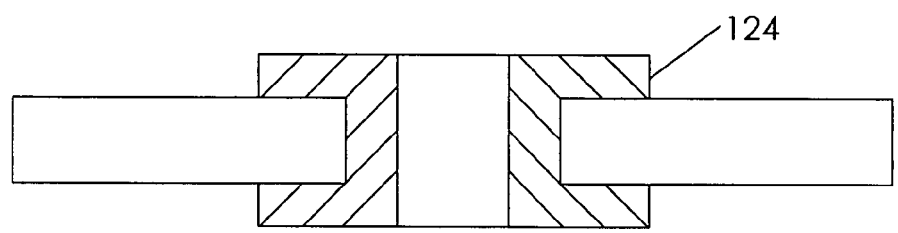
Figure 19C:
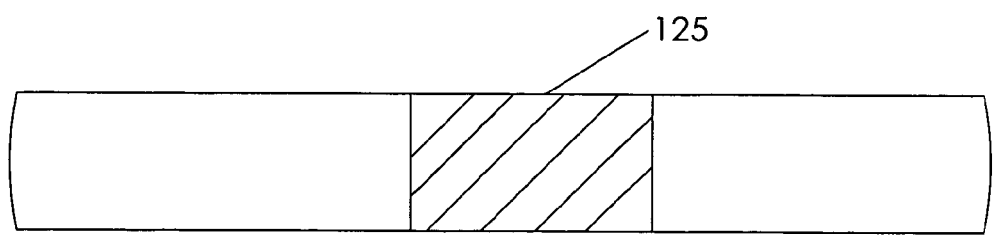

FIG. 19 depicts at least one laser cut via 122 in nitride layer 123. In this case the ability to form thin freestanding nitride layer 123 enables the use of this technique. Typical high resolution laser processing is limited to less than a couple hundred microns for reasonable power levels. The ability to form nitride layer 123 for laser drilling less the 200 microns in thickness is an embodiment of this invention. Contact means 124 and 125 can include, but not limited to, plated holes, conductive inks filled holes, and solder filled holes. The use of solder bump, gold bumping, and compressive contacts is also an embodiment of this invention.

Figure 20:
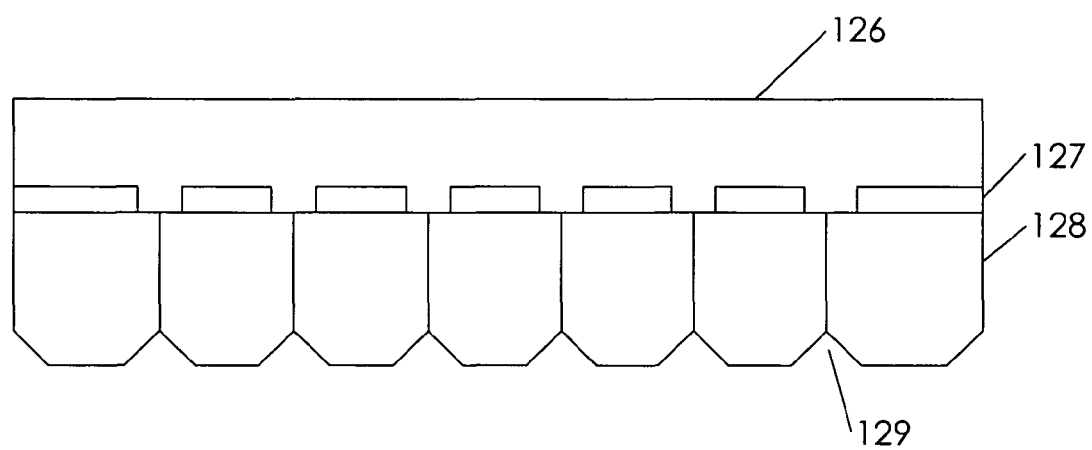
FIG. 20 depicts of an array of cleaved nitride layers with regrowth of the present invention.

FIG. 20 depicts the use of cleaved interfaces for regrowth. Regrowth layer 126 is grown on cleaved array 128 formed from a freestanding nitride layer. Laser scribes 129 are created in the nitride layer and mechanical, thermal, optical means are used to separate the individual elements forming cleaved array 128. The optional use of sacrificial layer 127 consists of a material which does not promote crystal growth such as, but not limited to, $SiO_2$, $Si_3N_4$, and other materials capable of handling the growth conditions. The use of separation techniques to separate the cleaved elements in cleaved array 128 is also disclosed. In this manner, regrowth can occur off high quality high aspect ratio surface leading to improved crystal quality in regrowth layer 126. Using this approach high quality non-polar nitride layers can be formed.

Figure 21:
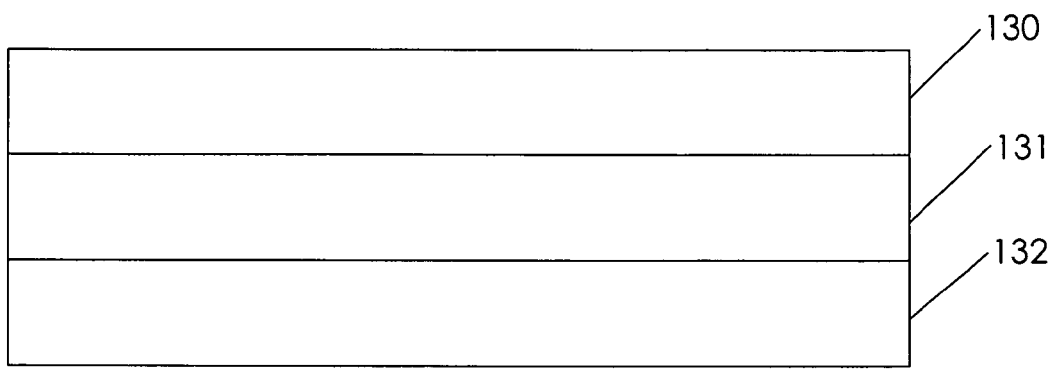
FIG. 21 depicts the lamination of at least two thin nitride layers together of the present invention.

FIG. 21 depicts a laminated stack of at least two nitride layers. Top nitride layer 130 and bottom nitride layer 132 are bonded together using bonding layer 131. Bonding layer 131 may include, but not limited to, organic and inorganic adhesives, metals, and other bonding materials. The use of stress control features as discussed previously can induce a particular stress pattern in either and/or both layers. The use of this assembly with appropriate electroding can form a bimorph. The use of a single layer with appropriate electroding can form a unimorph. The use of these actuators in biological applications is a preferred embodiment of this invention. The formation of features in the bonding layer 131 or the top nitride layer 130 and/or bottom nitride layer 132 can create microfluidic actuators. The formation of these features using laser ablation, lithography and chemical etching, and mechanical means is also an embodiment.

Figure 22:
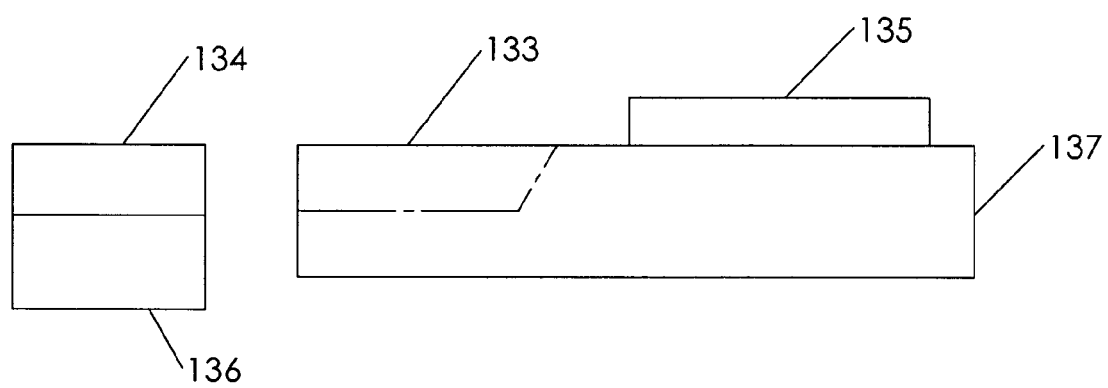
FIG. 22 depicts at least one laser diode and at least one control element built in a nitride layer and its use in an optical interconnect of the present invention.

FIG. 22 depicts a nitride layer 137 containing at least one laser diode 133 and control circuit 135 contained within nitride layer 137. The unique capability of the high crystal quality nitride layer 137 enables the formation of both types of devices in a single layer. The cleaveable nature of the freestanding nitride layer 137 and its use can form the exit surface for at least one laser diode 133. This combined element can be coupled to optical waveguide 134 in optical interconnect 136. The formation of alignment features within nitride layer 137 as previously disclosed can facilitate alignment of optical waveguide 134 to the output of at least one laser diode 133.

Figure 23:
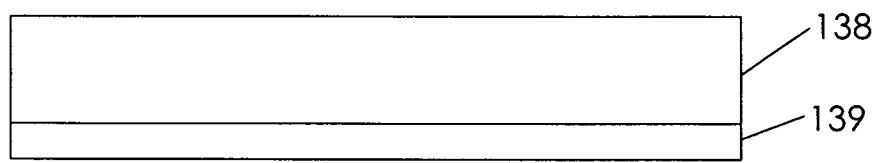
FIG. 23 depicts nitride layer with a contact on one side of the present invention.

FIG. 23 depicts at least one nitride layer 138 with a contact layer 139. The contact layer 139 may consist of, but not limited to, Omni Directional Reflector (ODR) which is diffuse, specular, and/or contains electrical interconnect means, reflective metal which does or does not form ohmic contact to the nitride layer, printed conductor, adhesive layer, and optical element including, but not limited to, wire grid polarizer, photonic crystal, microoptical element, and/or dichroic element. The article contains at least one nitride layer 138 and at least one type of contact layer 139. The use of contact layer 139 can adhere, extract light from, make electrical and/or mechanical contact to and induce a charge on nitride layer 138.

Figure 24A:
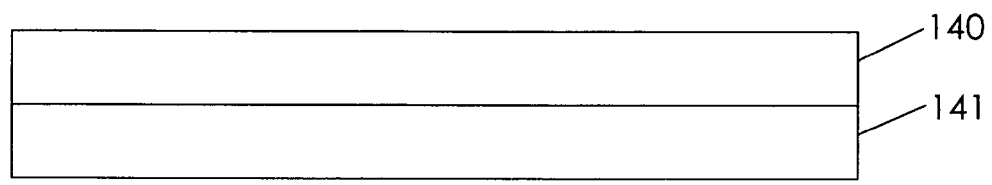
FIG. 24 depicts a large area diode formed using n doped and p doped nitride layers of the present invention.
Figure 24B:
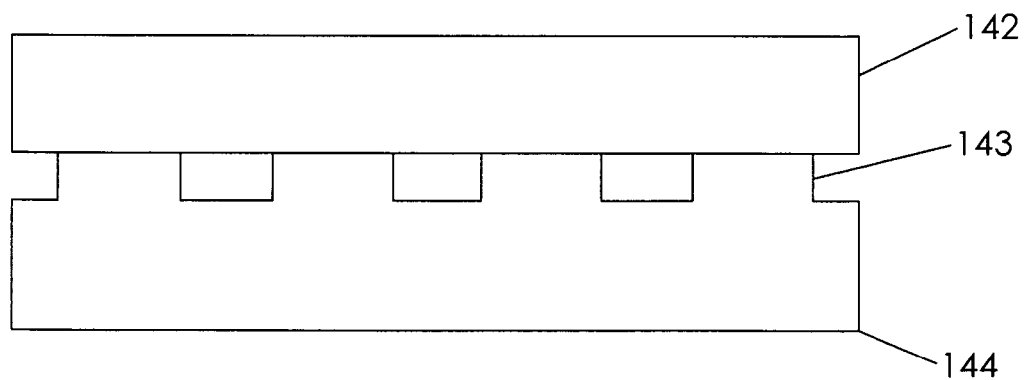

FIG. 24A depicts a large area diode formed by joining first nitride layer 140 to second nitride layer 141. As known in the art, large area diodes can be formed by waferbonding p and n type materials together. The use of thin nitride layers can form these types of devices. FIG. 24B depicts the use of first nitride layer 142 joined to second nitride layer 144 containing features 143 which may be formed by regrowth means described previously. The purpose of this approach is to facilitate improved bonding by allowing for the removal of trapped gases. These approaches are embodiments of this invention.

Figure 25:
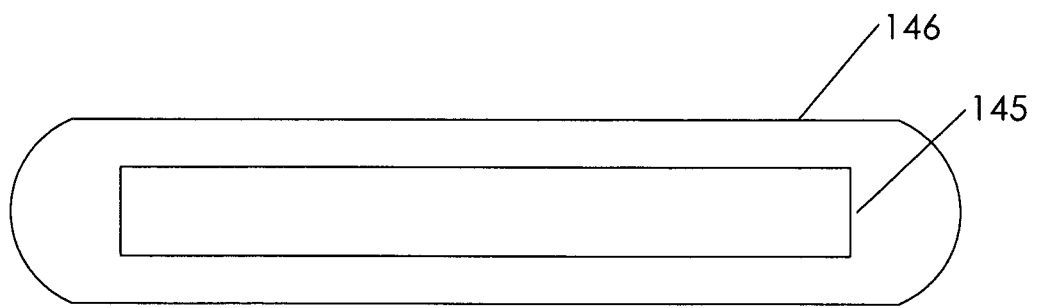
FIG. 25 depicts a nitride layer with encapsulating regrowth of the present invention.

FIG. 25 depicts at least one nitride layer 145 where substantially the entire at least one nitride layer 145 is encapsulated with coating 146. Coating 146 may include but not limited to amorphous coatings, epitaxial coatings, and metallic coatings. More preferably, coating 146 may consist of glasses, HVPE nitride regrowths, bio active coatings, pharmaceutical coatings and electrically conductive coatings. The use of epitaxial growth methods such as LPE, MBE, MOCVD, HVPE, and other epitaxial methods is an embodiment of this invention. Physical deposition methods include, but are not limited to, spraying, dipcoating, evaporation, sputtering, laser ablation, flame spraying, transfer coating, and lamination. The articles formed using this approach are heatsinks, drug delivery systems, RFID tags, epiwafers, and/or actuators. The use of at least one nitride layer 145 containing optical, optoelectronic, MEMs, and electrical elements along with this encapsulation technique is an embodiment of this invention.

Figure 26:
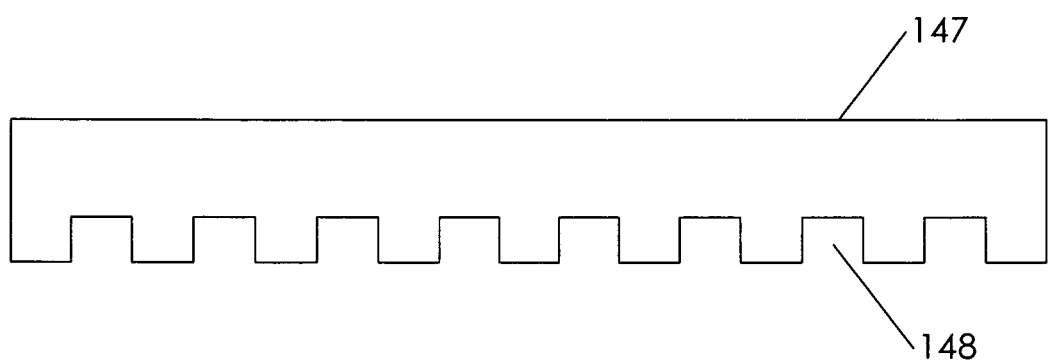
FIG. 26 depicts a large area LED on a nitride layer with microchannels on one side of the present invention.

FIG. 26 depicts at least one nitride layer 147 containing microchannels 148. These microchannels may be formed by, but not limited to, laser etching, etching process, and/or mechanical means. These channels can be used for cooling either as passageways for the cooling media or increased surface area, microfluidic channels, wells for drug and/or bio-active materials, and mounting features for additional devices to be mounted.

Figure 27:
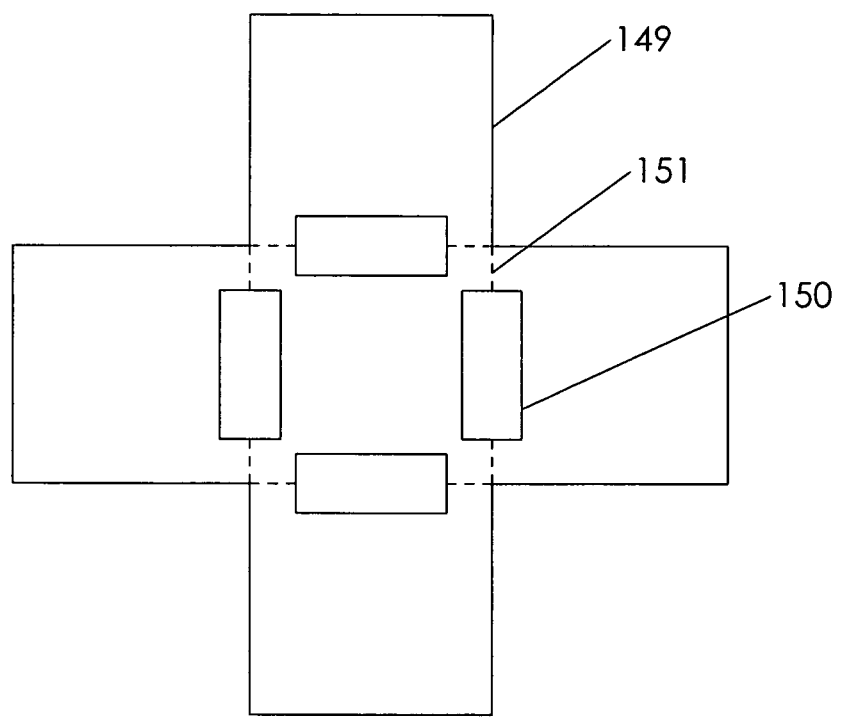
FIG. 27 depicts a foldable 3 dimensional LED based on a nitride layer with hinges of the present invention.

FIG. 27 depicts a foldable nitride layer 149 containing at least one hinge 150 and one foldline 151. The hinge 150 may be, but not limited to, metal, polymer, or other flexible element. The hinge 150 may provide electrical connection or act as an insulator between the segments of foldable nitride layer 149 across foldline 151. The use of laser scribing, etching, and mechanical means can create foldline 151. Both the unfolded and folded article created using this technique is an embodiment of this invention.

Figure 28A:
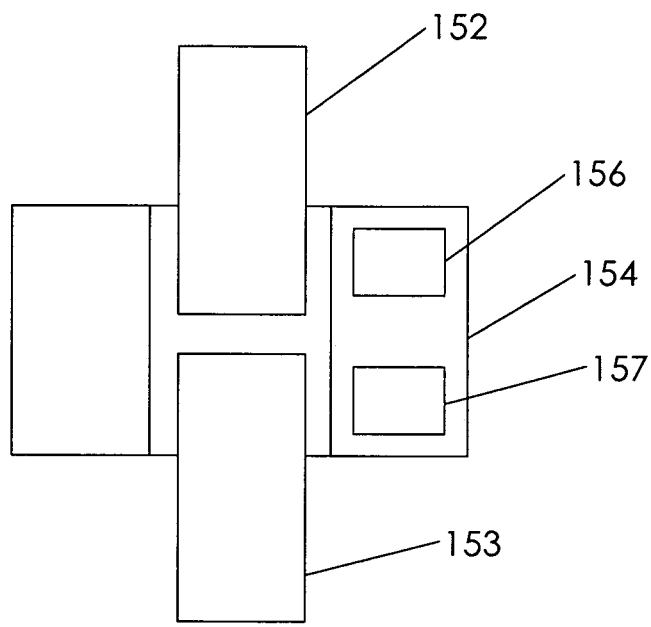
FIG. 28 depicts a nitride layer with an alignment feature for coupling at least two optical fibers of the present invention.
Figure 28B:
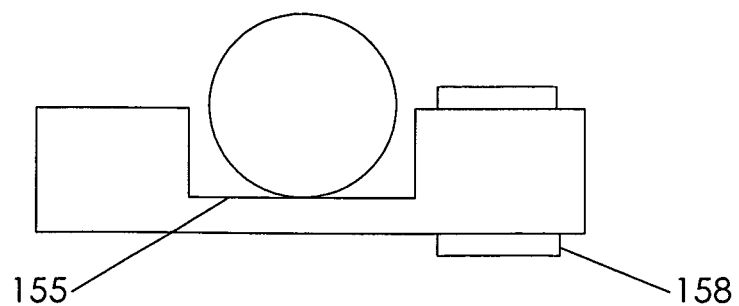

FIG. 28 depicts two fibers 152 and 153 in alignment groove 155 formed in nitride layer 154. Electrodes 156, 157 and 158 are formed onto nitride layer 154 and are used to apply current to nitride layer 154. The use of previously disclosed piezoelectric elements may be incorporated into the approach to allow for active alignment of fibers, optical elements and electrical contacts.

Figure 29:
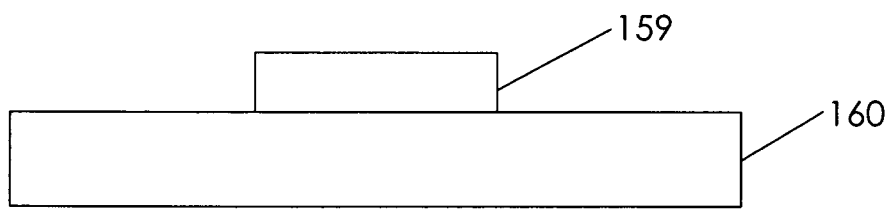
FIG. 29 depicts a nitride layer as a heatspreader of the present invention.

FIG. 29 depicts the use of nitride layer 160 as a heatspreading layer for heatsource 159. More preferably, the nitride layer 160 would have a thermal conductivity of greater than 200 W/m/K along the c axis with a thermal expansion at room temperature less than 4 ppm. Alternately, a plane nitride layer 160 may be used for heatsource 159 to allow for thermal matches to higher expansion heatsource 159 with a thermal conductivity greater than 150 W/m/K and a thermal expansion at room temperature greater than 4 ppm. In this manner, high powered heatsources 159 can be cooled with a matching thermal expansion coefficient using different crystal orientations for nitride layer 160. The use of previously disclosed techniques to remove the heat from the heatspreading layer is also an embodiment of this invention.

Figure 30:
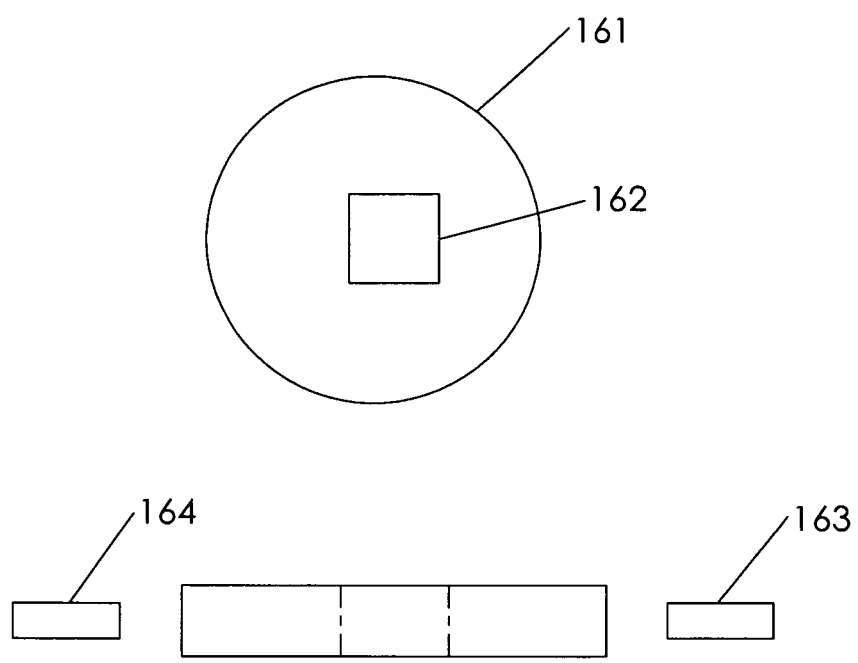
FIG. 30 depicts a nitride layer as a gasket of the present invention.

FIG. 30 depicts a nitride layer 161 with a feature 162 cut preferably by, but not limited to, laser machining, chemical etching and mechanical means. The use of laser machining is a preferred embodiment of this invention. The combination of the thinness of nitride layer 161 and ease with which it can be laser machined due to conversion of the GaN to Gallium and nitrogen enables the formation of complex features for use as but not limited to filters, gaskets, spring washers, and other mechanical flat parts that require high temperature, chemical resistance, and/or biocompatibility. More preferably, the use of these elements as optically clear elements through which optical sensing can be done as depicted in FIG. 30 where light source 163 is coupled into the edge of nitride layer 162 such that the material being passed through the feature 162 is exposed to the emitted light from light source 163 recoupled into nitride layer 162 and then detected by the detector 164. The optical transmittance of the nitride layer extends from the deep UV down through the IR wavelength range. The integration of either and/or both the light source 163 and the detector 164 into the nitride layer is an embodiment of this invention.

Figure 31:
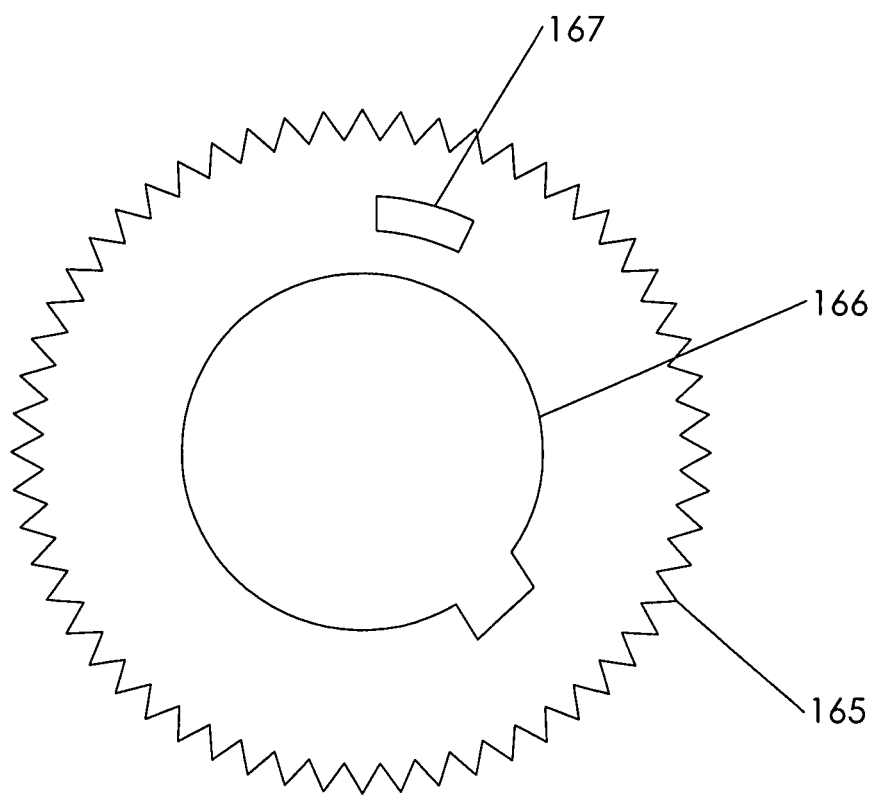
FIG. 31 depicts a nitride layer laser cut to form a gear of the present invention.

FIG. 31 depicts a nitride layer 165 cut into a gear. A variety of inner features 166 are possible including, but not limited to, holes, keyed holes, non-circular features, and slots. The inclusion of a strain gauge 167 can be either created in the nitride layer 165 or attached to nitride layer 165.

Figure 32:
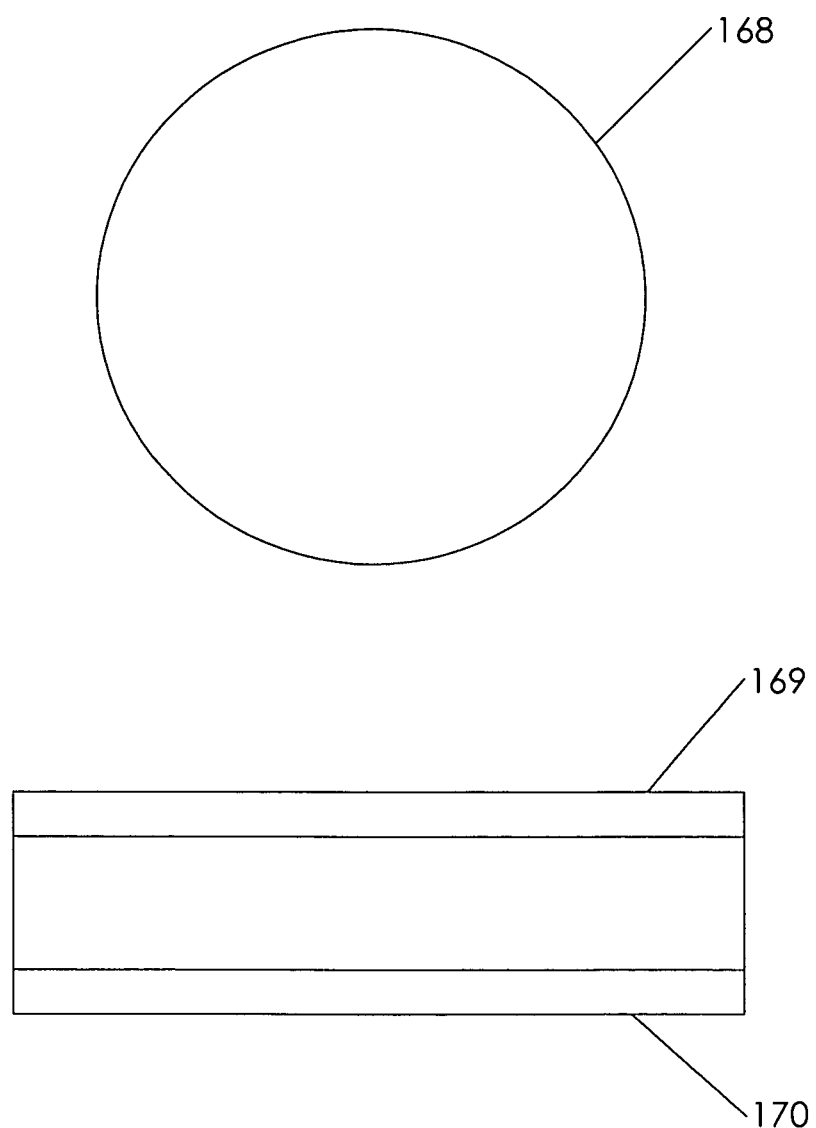
FIG. 32 depicts a nitride layer as an optical window of the present invention.

FIG. 32 depicts a nitride layer 168 forming an optical element. By adjusting the alloy composition of the nitride layer 168, a highly selective adjustable UV absorbing filter can be formed. The range of adjustment can be from 6.0 ev for AlN down to 0.7 ev for InN with any bandedge in between. Additionally, the tailored absorption spectrums can be created using additional layers 169 and 170 on one or both surfaces of nitride layer 168. Additional layers 169 and 170 may also include but not limited to dichroic coatings, polarization layers, birefringent layers, photonic crystals structures, subwavelength structures, cladding layers, and luminescent layers. The introduction of luminescent species or elements in the nitride layer 168, and/or additional layers 169 and 170 can cause wavelength conversion and/or gain media. The use of this element to create a gain cavity for a laser is also an embodiment of this invention. More preferably, the formation of a gain cavity based on doping elements within the nitride layer 168 and the formation of the cavity by at least one surface of the nitride layer 168 being cleaved along a crystal plane is an embodiment. In these cases, most preferred is the use of these techniques within the wavelength ranges where the absorption coefficient alpha is below 1 $cm^{-1}$.

Figure 33:
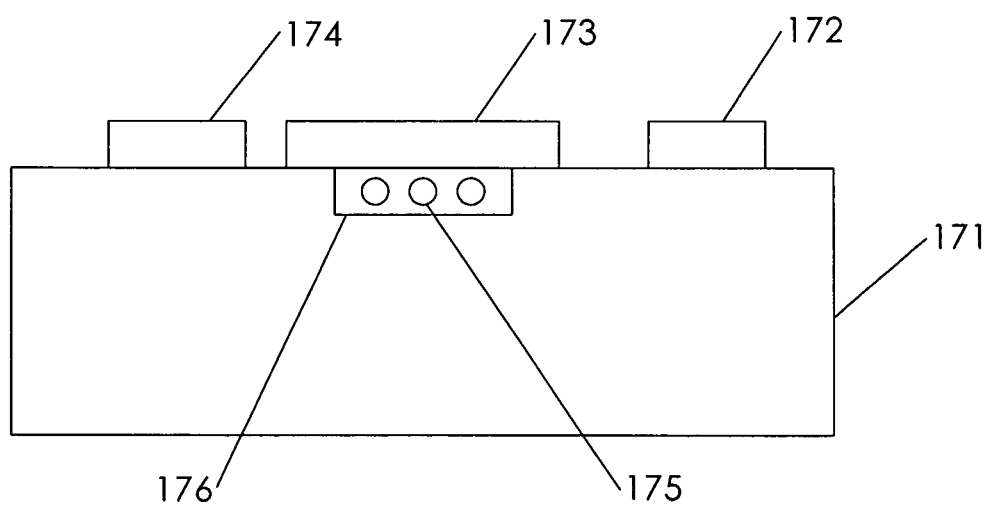
FIG. 33 depicts a nitride layer with at least one pocket cut into it surface containing a drug and a dissolvable overcoat of the present invention.

FIG. 33 depicts a nitride layer 171 in which at least one pocket 176 is formed which contains at least one drug 175 to be delivered internal to the body. The delivery of at least one drug 175 to be determined by rupture of cover 173 either via the solubility of cover 173 or via induced means created by circuit elements 172 and 174. Most preferably these elements are created directly within nitride layer 171 and may include, but not limited to, receivers, charge storage elements, piezoelectric actuators, antennas, and optical absorbers. The intent being to create an element which would only deliver the drug upon activation once the target tumor or body part was in proximity to the nitride layer. The benefit of this approach is that nitrides can make a wide range of optically and electrically active elements while still being biocompatible.

Figure 34:
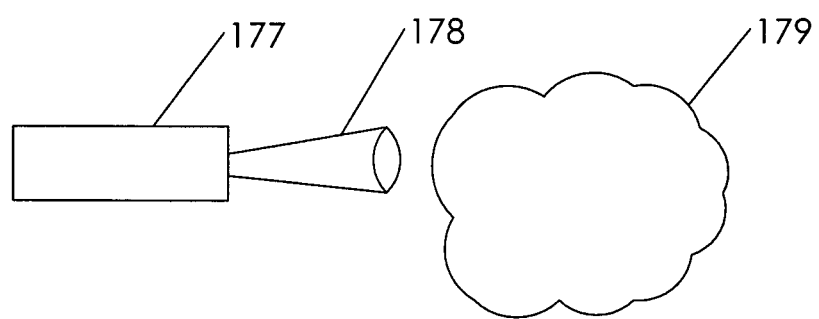
FIG. 34 depicts a nitride layer for an implantable laser source for localized therapy of the present invention.

FIG. 34 depicts an implantable laser therapy device 177 created using a freestanding nitride layer as described above. The laser, controller and receiver can be created within a freestanding nitride layer. More preferably the approach and device can generate radiation 178 that is implantable. Even more preferably this approach can generate radiation between 10 microns and 200 nm in wavelength. Most preferable is the use of this approach to locally radiate a target including but not limited to a tumor, ligament, muscle, or other body part 179. The implantable laser therapy device 177 may be injected, surgically implanted, swallowed or located within a body opening. The use of externally coupled radiation can excite the emitting source internal to the body. The implantable laser therapy device 177 may be temporarily or permanently implanted. The use of VCSEL, EELED, laser diode, and LED sources in this device is an embodiment of this invention. The use of the nitride layer can couple light from the emitter into a directional or isotropic pattern from the emitter.

Figure 35:
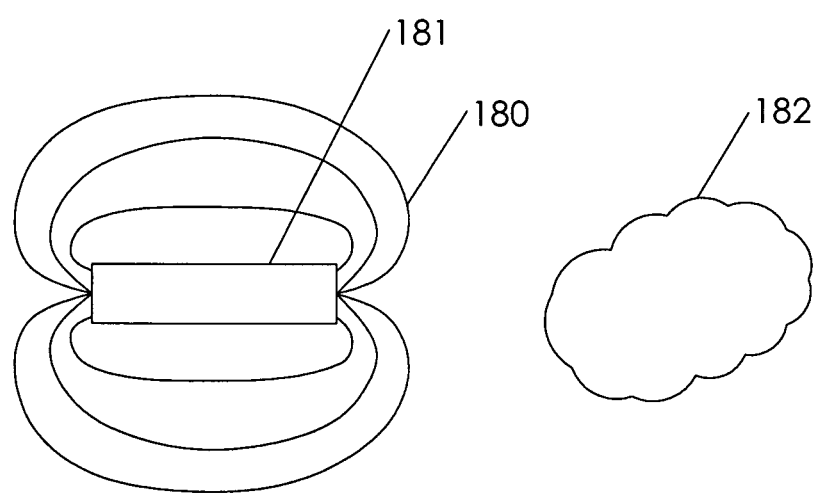
FIG. 35 depicts an implantable high frequency source on a nitride layer for tumor therapy of the present invention.

FIG. 35 depicts an implantable radiation therapy device 181 created using a freestanding nitride layer as described above. The emitter, controller and receiver can be created within a freestanding nitride layer. More preferably the approach and device can generate radiation 180 that is implantable. Even more preferably, this approach can generate radiation between 1 Ghz in frequency and 10 microns in wavelength. Most preferable is the use of this approach to locally radiate a target including but not limited to a tumor, ligament, muscle, or other body part 182. The implantable radiation therapy device 181 may be injected, surgically implanted, swallowed or located within a body opening. The use of externally coupled radiation can excite the radiation source internal to the body. The implantable radiation therapy device 181 may be temporarily or permanently implanted. The use of implantable radiation therapy devices 181 emitting within the terahertz range for gene therapy is an embodiment of this invention.

Figure 36:
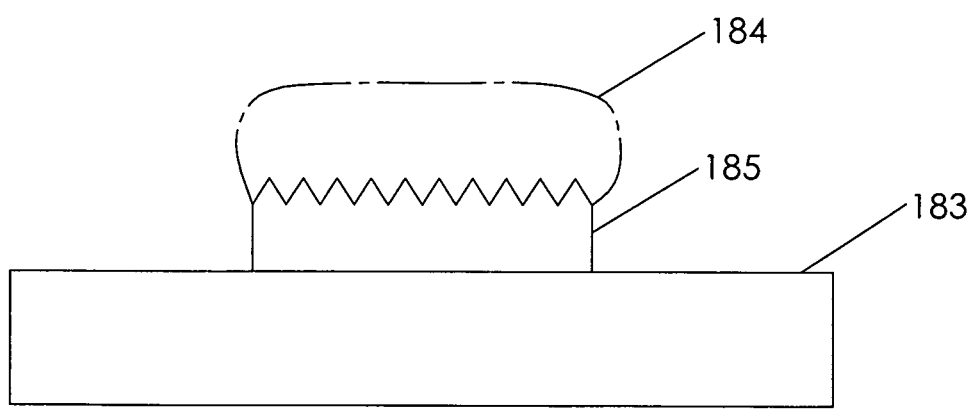
FIG. 36 depicts a biocompatible surface on a semiconductor element formed on a nitride layer of the present invention.

FIG. 36 depicts a nitride layer 183 containing at least one semiconducting element 185 to which a biological species 184 is in contact. This device takes advantage of the biocompatibility of the nitrides. Stimulation from device grown on the nitride layer 183 using electrical, optical, or magnetic radiation can enhance cellular growth and/or attachment. Formation of surface textures conducive to cellular attachment is also an embodiment of this invention. The intent of this embodiment is to form a bio-compatible interface to biological species 184 for control, destruction, detection, and modification of the biological species 184.

Figure 37A:
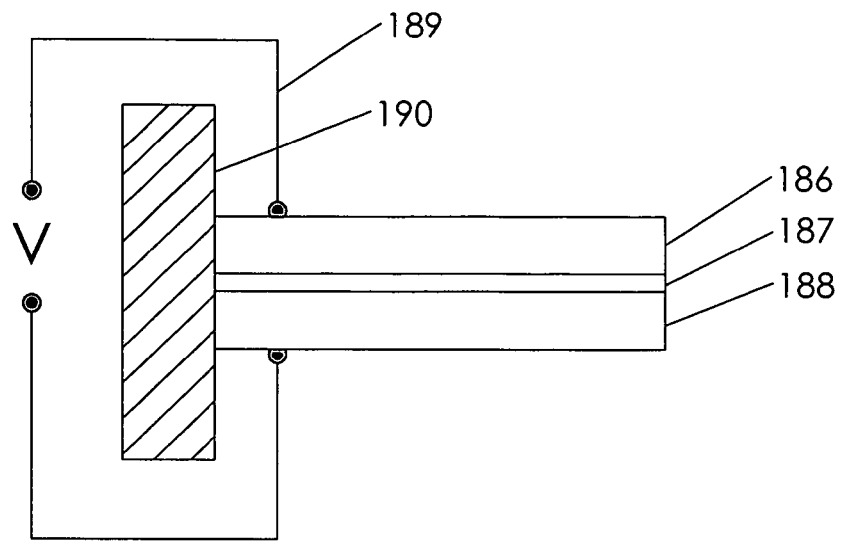
FIG. 37 depicts a bimorph formed by laminating two nitride layers together of the present invention.
Figure 37B:
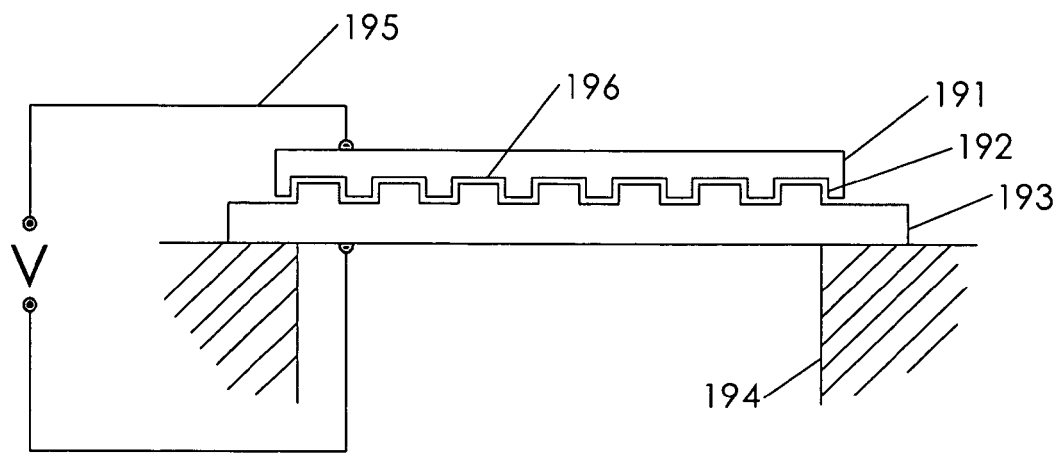

FIG. 37A depicts a bimorph contain at least one nitride layer 186 created using the techniques described previously. At least one nitride layer 186 is bonded to second layer 188 using bonding layer 187. Second layer 188 may consist of another piezoelectric layer including, but not limited to, nitrides, oxides, diamond, metals, and other high stiffness materials. Actuation occurs via electrical contacts 189. The support 190 constrains the bimorph on at least one end. FIG. 37B depicts a bimorph constrained on both ends by support 194. Nitride layer 193 and bonding layer 192 along with second layer 191 form the bimorph. Actuation occurs via electrical connections 195. The use of high Al content nitrides is preferred. The formation of surface features 196 as discussed previously can enhance displacement, create an adjustable grating, or form a microfluidic pump element. The use of patterned regrowth can create patterned regions of high Al content nitrides. The use of arrays of bimorphs can form a spatial light modulator.

Figure 38:
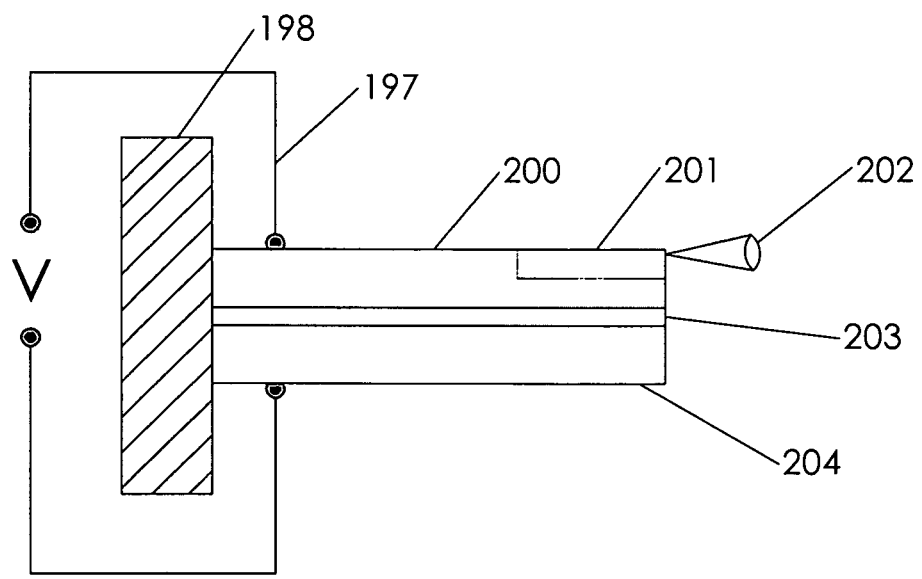
FIG. 38 depicts a bimorph formed by laminating two nitride layers together with at least one active element formed on at least one of the nitride layers of the present invention.
Figure 39:
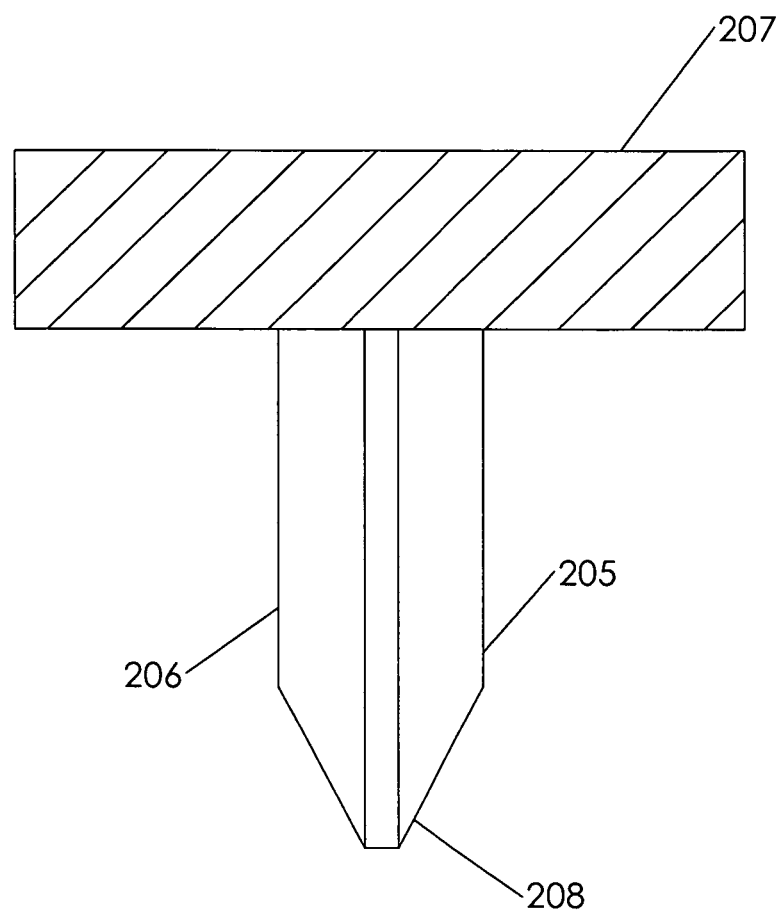
FIG. 39 depicts an ultrasonic scalpel formed using a bimorph containing at least one nitride layer of the present invention.

FIG. 38 depicts a bimorph with at least one active element 201. At least one nitride layer 200 containing one or more of the active elements 201 is bonded using bonding layer 203 and second layer 204 to form a movable active element. Interconnect 197 is used to actuate the bimorph and the use of additional interconnects can control the at least one active element 201. Support element 198 becomes the fixed reference point about which emitted radiation 202 moves. This approach can guide or redirect the emitted radiation 202. More preferably the use of this approach can form an optoelectronic switch. The ability to cleave the nitride layer 200 is an important aspect of this embodiment FIG. 39 depicts a cutting tool formed from at least one nitride layer 205 and 206. The replacement of one of the at least one nitride layer 205 or 206 with a hard sharpened element such as, but not limited to, diamond, metals, sapphire, or other materials that can take a suitable sharp edge 208 is an embodiment. Support 207 may be fixed or represent a handle for manual or machine based motion. The formation of a bimorph to move the cutting tool as discussed previously is an embodiment.

Figure 40:
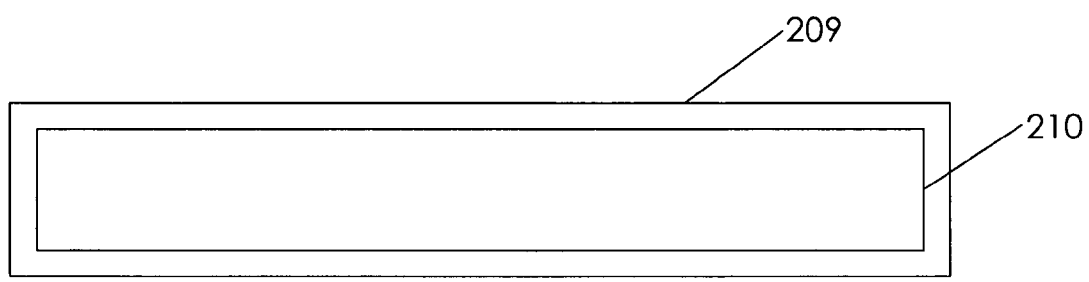
FIG. 40 depicts a nitride layer with chemically modified surfaces for enhanced adhesion of the present invention.

FIG. 40 depicts at least one nitride layer 210 in which chemical modification of the surface of the at least one nitride layer 210 forms a chemically modified surface 209. The modification being for the purpose of, but not limited to, improved adhesion, prevent adhesion, form a hydrophilic surface, form a hydrophobic surface, become protein selective, seed the surface for electroplating, or oxidize the surface. The use of masking methods as know in the art can create spatially defined regions of chemical modification.

Figure 41:
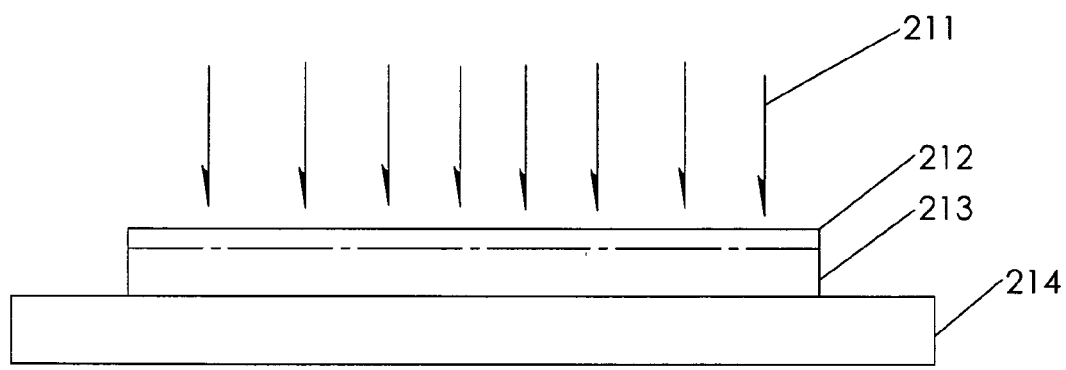
FIG. 41 depicts a nitride layer radiation annealed prior to separation of the present invention.

FIG. 41 depicts the use of radiation means 211 to modify the surface of at least one nitride layer 213 such that at least a portion 212 of at least one nitride layer 213 is exposed while attached to growth layer 214. The intent being the modification of the crystal structure of at least one nitride layer 213 to effect annealing, change in index, change in dopant concentration, and/or impart a charge in at least one nitride layer 213.

Figure 42:
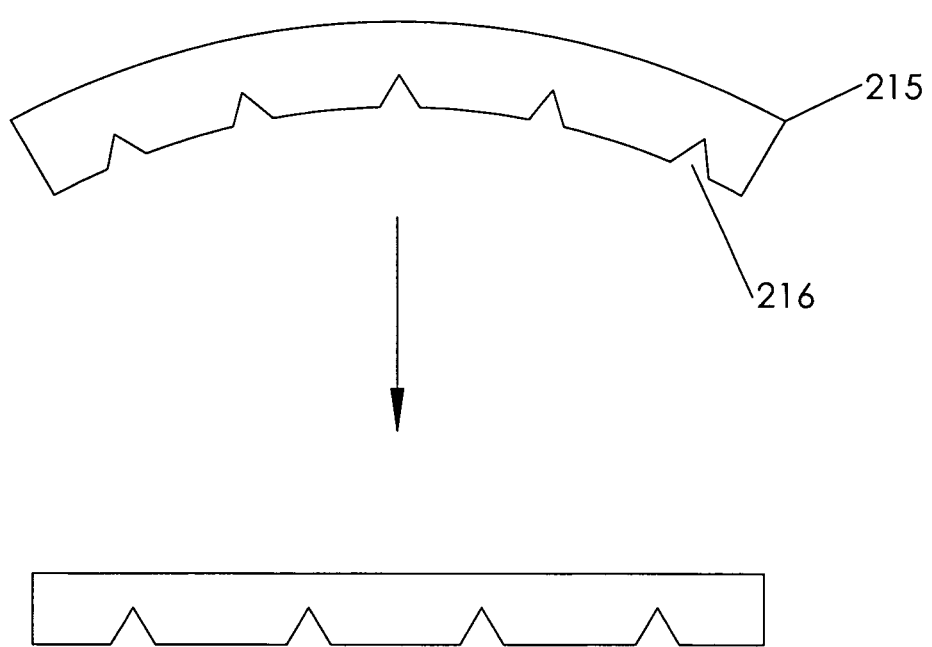
FIG. 42 depicts a nitride layer annealed after separation of the present invention.

FIG. 42 depicts a freestanding nitride layer 215 exhibiting bow. The process of annealing a freestanding nitride layer 215 can reduce bow. More preferably, the use of stress control features 216 in freestanding nitride layer 215 can further control bow along with annealing.

Figure 43:
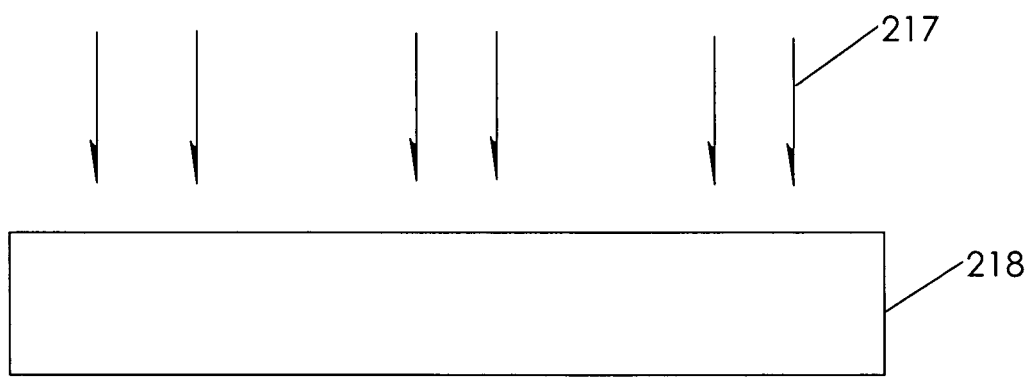
FIG. 43 depicts a nitride layer spatially modified using electron beam of the present invention.

FIG. 43 depicts the use of spatially defined irradiation 217 to locally modify the properties of nitride layer 218. The spatially defined irradiation 217 includes, but is not limited to, actinic radiation. The use of masking, sacrificial layers, and scanned radiation sources to form the pattern is an embodiment.

Figure 44:
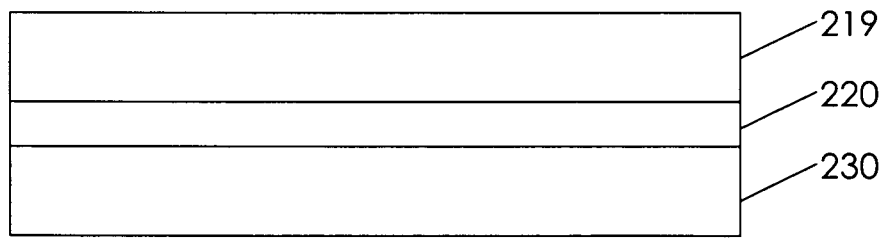
FIG. 44 depicts waferbonded LED to nitride layer of the present invention.

FIG. 44 depicts a LED in which at least one emitting structure 219 is bonded via bonding layer 220 to at least one nitride layer 230. The most preferred embodiment being that at least one emitting structure is a nitride LED. In this manner thermal expansion coefficients can be matched allowing for high temperature operation.

Figure 45:
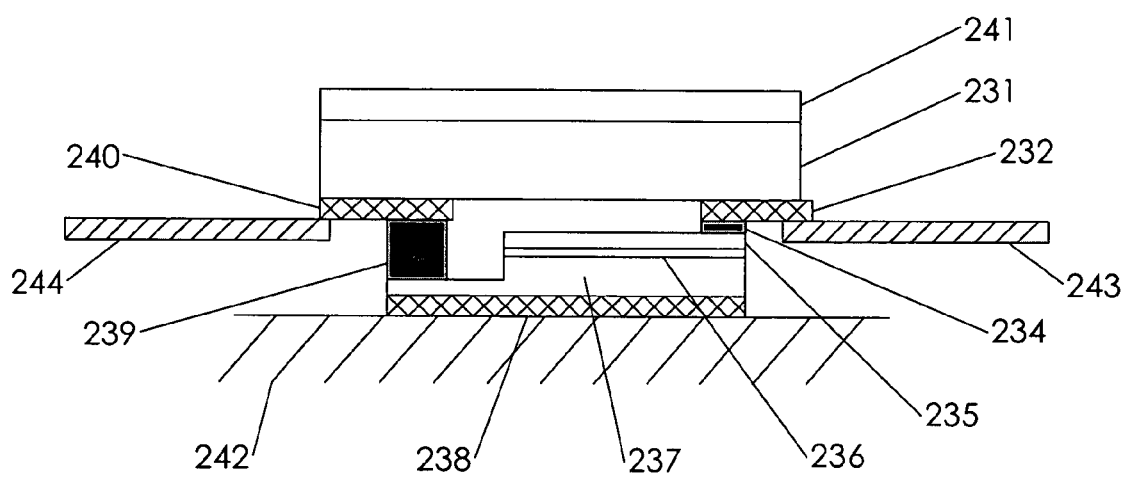
FIG. 45 depicts reverse flip chip mounted led on nitride layer of the present invention.

FIG. 45 depicts a reverse flip chip mounted LED. At least one nitride layer 231 containing contacts 232 and 240 to which LED contacts 234 and 239 are attached. LED contacts 239 and 234 are ohmically connected across LED containing p contact layer 235, active region 236 and n contact layer 237. The addition of a bond pad 238 provides thermal attachment to thermal cooling means 242. Electrical connections 243 and 244 attach to contacts 232 and 240 as well. Alternately wavelength conversion layer 241 may be, but not limited to, grown, attached, coated, and/or be a dopant within at least one nitride layer 230.

Figure 46:
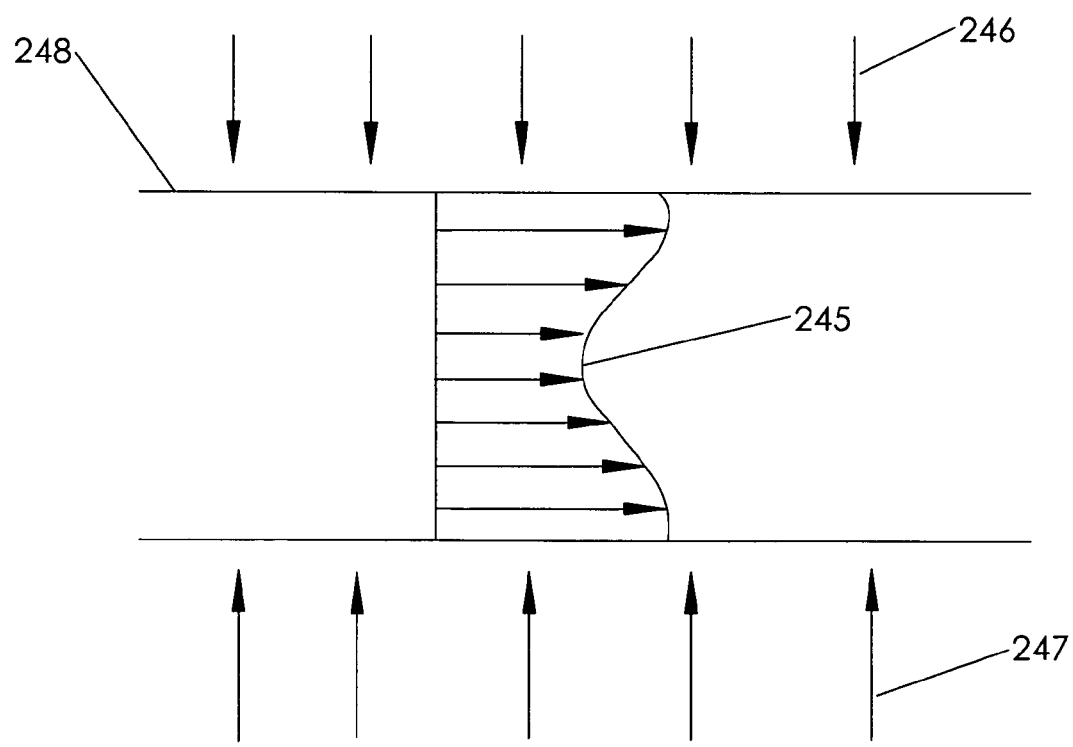
FIG. 46 depicts a nitride substrate with graded stress profiles formed by electron beam irradiation of the present invention.

FIG. 46 depicts a depth dependent property profile 245 within at least one nitride layer 248. The use of actinic radiation 246 and 247 from one or both sides of at least one nitride layer 248 is an embodiment of this radiation. More preferred is the use of electron beam radiation for actinic radiation 246 and/or 247 due to the ability to depth of penetration and flux levels. Even more preferred is electron beam irradiation with an energy between 1 and 50 Key. The intent of this approach is to modify the surface region of the at least one nitride layer 248. The use controlled atmosphere and thermal heating can facilitate changes in material properties of at least one nitride layer 248.

Figure 47:
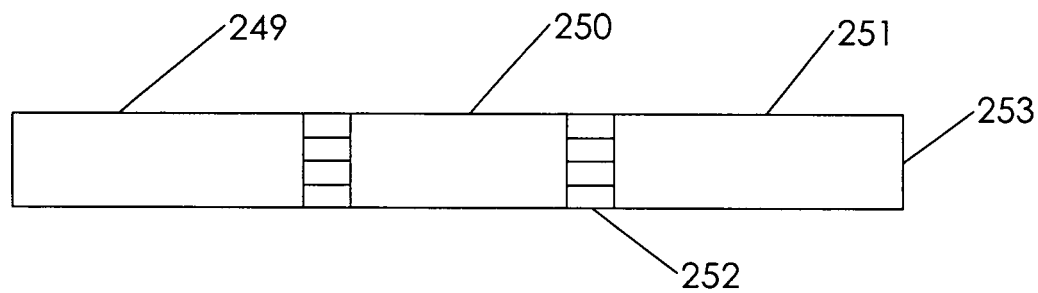
FIG. 47 depicts edge bonding of at least two nitride layers of the present invention.

FIG. 47 depicts bonding of at least two nitride layers 249, 250 and 251 substantially along their thinnest region 253 forming bond line 252. The use of, but not limited to, adhesives, glasses, evaporation, fusion bonding, wafer bonding can create bond line 252. Most preferably the cleaving of at least one face of at least two nitride layers 249,250, and 251 and fusion bonding is an embodiment.

Figure 48:
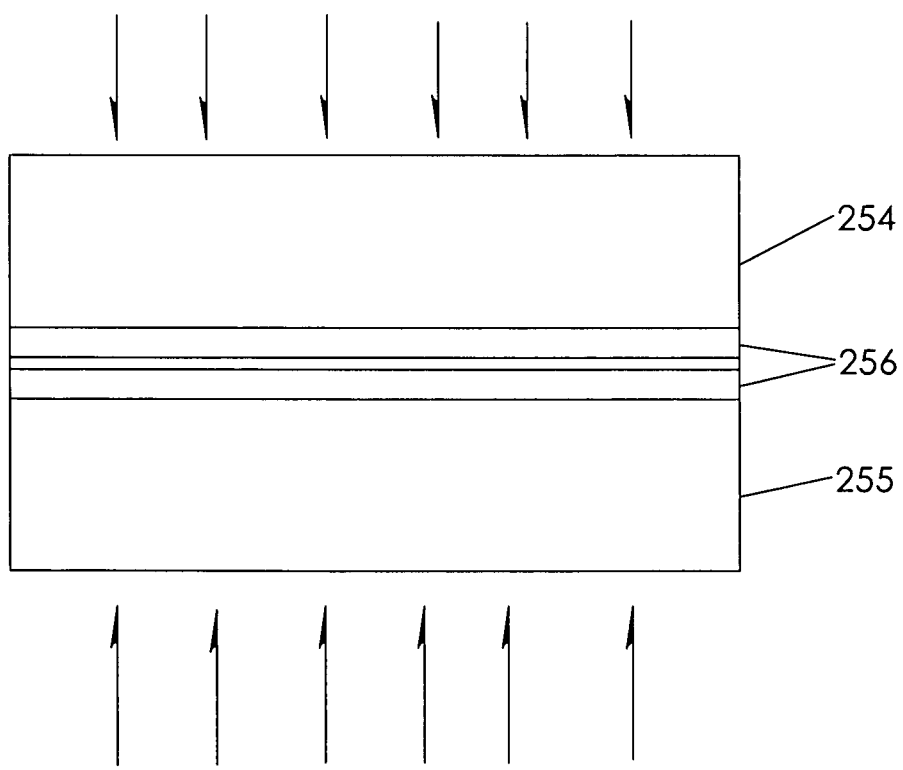
FIG. 48 depicts waferbonding of two nitride layers of the present invention.

FIG. 48 depicts waferbonding of at least two nitride layers 254 and 255 based on conversion of excess gallium 256 formed during separation into gallium oxide via heat, oxygen, and pressure 257. The formation of features on the inner surfaces of at least two nitride layers 254 and 255 can allow for gas flow.

While the invention has been described with the inclusion of specific embodiments and examples, it is evident to those skilled in the art that many alternatives, modifications and variations will be evident in light of the foregoing descriptions. Accordingly, the invention is intended to embrace all such alternatives, modifications and variations that fall within the spirit and scope of the appended claims.

The invention claimed is:

1. A method of lateral regrowth on at least one side of a freestanding nitride layer comprising:
    laser ablation of high aspect ratio features in said freestanding nitride layer;
    photochemical, chemical, or mechanical etching of said high aspect ratio features;
    formation of at least one sacrificial layer prior to said laser ablation; and
    at least one epitaxial regrowth step which preferentially favors later growth.

2. A method of forming a higher quality nitride layer on a freestanding nitride layer comprising:
    deposition of a sacrificial layer on said freestanding nitride layer;
    formation of trenches; and
    lateral overgrowth to form said higher quality nitride layer.

3. A method comprising:
    forming high crystal quality low stress nitride alloys based on growth on flexible freestanding nitride layers.

4. A method comprising:
    using an array of cleaved interfaces from freestanding nitride layers to form high quality nitride layers;
    wherein said high quality nitride layers are substantially non-polar in orientation.

5. A process comprising
    formation of excess gallium on at least one surface of at least two freestanding nitride layers; and
    application of heat and pressure to the at least two freestanding nitride layers.

* * * * *